United States Patent
Takahashi

(10) Patent No.: US 8,796,533 B2
(45) Date of Patent: Aug. 5, 2014

(54) THERMOELECTRIC CONVERSION MODULE AND CONNECTOR FOR THERMOELECTRIC CONVERSION ELEMENTS

(75) Inventor: Ko Takahashi, Koto-ku (JP)

(73) Assignee: Universal Entertainment Corporation, Tokyo (JP)

( * ) Notice: Subject to any disclaimer, the term of this patent is extended or adjusted under 35 U.S.C. 154(b) by 836 days.

(21) Appl. No.: 12/300,649

(22) PCT Filed: Jun. 11, 2007

(86) PCT No.: PCT/JP2007/061761
§ 371 (c)(1),
(2), (4) Date: Nov. 13, 2008

(87) PCT Pub. No.: WO2007/145183
PCT Pub. Date: Dec. 21, 2007

(65) Prior Publication Data
US 2009/0126771 A1    May 21, 2009

(30) Foreign Application Priority Data

Jun. 14, 2006 (JP) .................................. 2006-164498

(51) Int. Cl.
*H01L 35/08* (2006.01)
(52) U.S. Cl.
USPC ............ 136/203; 136/205; 136/226; 136/233
(58) Field of Classification Search
CPC .......... H01L 35/06; H01L 35/10; H01L 35/08
USPC .................. 136/203, 205, 226, 233
See application file for complete search history.

(56) References Cited

U.S. PATENT DOCUMENTS

| | | | | |
|---|---|---|---|---|
| 824,684 | A * | 6/1906 | Cove | 136/212 |
| 2,391,994 | A * | 1/1946 | McCollum | 244/134 D |
| 2,652,503 | A * | 9/1953 | Pack | 136/212 |
| 6,388,186 | B1 * | 5/2002 | Nomura et al. | 136/224 |
| 2008/0087317 | A1 | 4/2008 | Takahashi | |

FOREIGN PATENT DOCUMENTS

| | | |
|---|---|---|
| JP | 63 201361 | 6/1987 |
| JP | 63 213980 | 9/1988 |
| JP | 1 110457 | 7/1989 |

(Continued)

OTHER PUBLICATIONS

English abstract of JP 2005-51103, Feb. 2005.*
Supplementary European Search Report for European Patent Application No. 07745050.0 issued Aug. 31, 2012.

*Primary Examiner* — Thanh-Truc Trinh
(74) *Attorney, Agent, or Firm* — KMF Patent Services, PLLC; S. Peter Konzel; Kenneth M. Fagin

(57) ABSTRACT

A connector for a thermoelectric conversion element free of a continuity failure and that is high in electrical reliability. In a thermoelectric conversion module, each thermoelectric conversion element has first and second electrode faces, and the thermoelectric conversion elements adjacent to each other are electrically connected thereto via connectors formed in a predetermined shape. Further, the connectors include a pair of fitted portions that are engagingly mounted to a first electrode face and another second electrode of the thermal electric conversion elements that are adjacent thereto, and a connection portions for connecting one pair of these fitted portions.

18 Claims, 22 Drawing Sheets

(56) References Cited

FOREIGN PATENT DOCUMENTS

| | | |
|---|---|---|
| JP | 7 211944 | 8/1995 |
| JP | 9 51126 | 2/1997 |
| JP | 9 74228 | 3/1997 |
| JP | 2003-262425 A | 9/2003 |
| JP | 2005-51103 * | 2/2005 |
| WO | 2005 124881 | 12/2005 |

* cited by examiner

FIG.11

CALCULATED VALUES OF OUTPUT CHARACTERISTICS ACCORDING TO ELEMENT SHAPE

| THERMAL RESISTANCE (m²·K/W) | SHAPE | RESISTANCE (Ω) | TEMPERATURE DIFFERENCE (°C) | OPEN-CIRCUIT VOLTAGE (mV) | SHORT-CIRCUIT CURRENT (A) | MAXIMUM OUTPUT (mW) | OUTPUT DENSITY (W/cm²) |
|---|---|---|---|---|---|---|---|
| 0.005 | PLATY | 0.0047 | 43.6 | 10.9 | 2.33 | 6.34 | 0.010 |
| 0.005 | LONGITUDINALLY ELONGATED | 0.075 | 137.1 | 34.3 | 0.457 | 3.92 | 0.024 |
| 0.001 | PLATY | 0.0047 | 160.0 | 40.0 | 8.53 | 85.3 | 0.133 |
| 0.001 | LONGITUDINALLY ELONGATED | 0.075 | 320.0 | 80.0 | 1.07 | 21.3 | 0.133 |

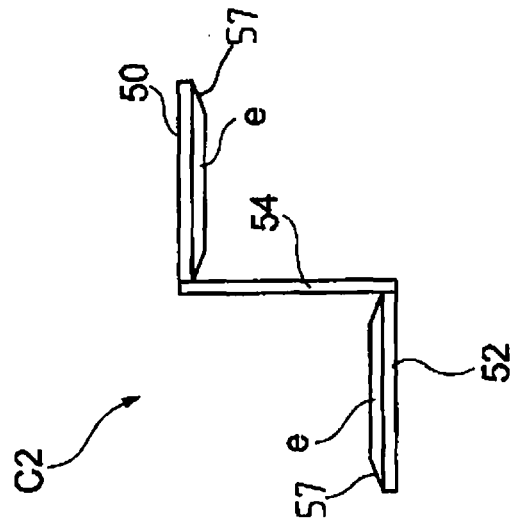
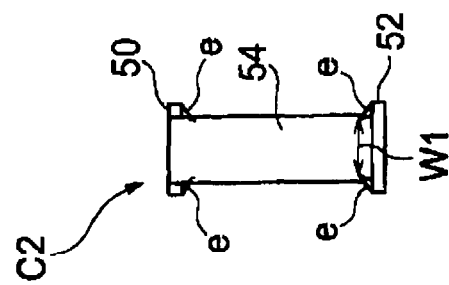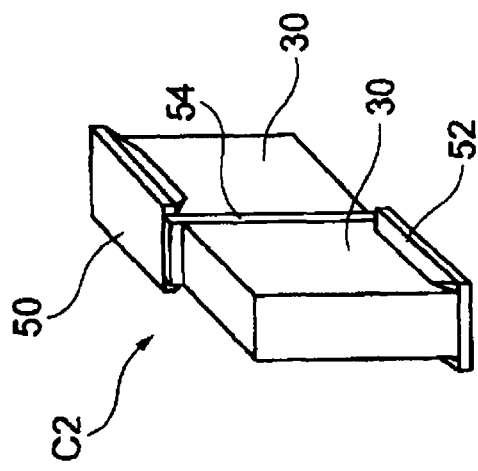

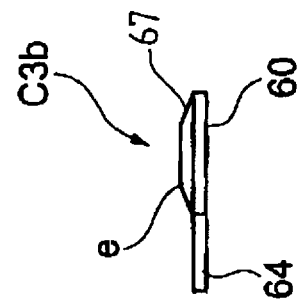
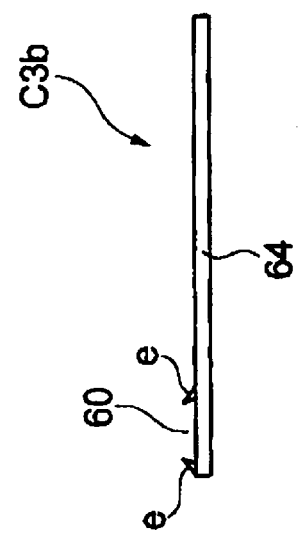
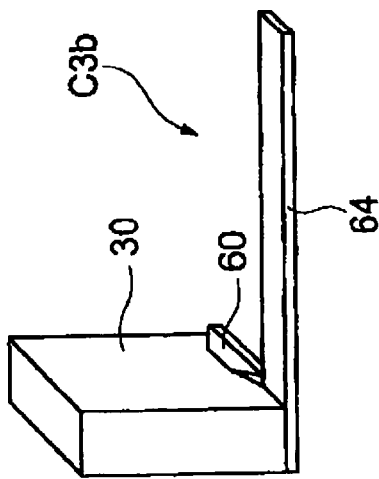

THERMOELECTRIC CONVERSION MODULE AND CONNECTOR FOR THERMOELECTRIC CONVERSION ELEMENTS

TECHNICAL FIELD

The present invention relates to: a thermoelectric conversion module, which is formed by arranging a thermoelectric conversion element on a substrate and electrically connecting an electrode of the thermoelectric conversion element and the remaining electrode different therefrom, via a conductive connector formed in a predetermined shape; and a connector for thermoelectric conversion elements, which is intended for electrically connecting the electrode of the thermoelectric conversion element to the other electrode.

BACKGROUND ART

A term "thermoelectric conversion" denotes converting thermal energy and electrical energy to each other by utilizing the Seebeck effect or the Peltier effect. Utilizing this thermoelectric conversion, electric power can be taken-out from a thermal flow with the use of the Seebeck effect, and further, it becomes possible to produce an endothermic cooling phenomenon by feeding a current to a material with the use of the Peltier effect. Owing to direct conversion, the thermoelectric conversion has a variety of features that: no redundant waste product is expelled at the time of energy conversion, and further, it is possible to effectively utilize an exhaust heat; and that there is no need for maintenance because no movable equipment such as motor or turbine is required. Therefore, the abovementioned thermoelectric conversion comes to the fore as a technique of efficiently utilizing energy. A metal, which is referred to as a thermoelectric conversion element or a semiconductor element, is generally employed for thermoelectric conversion. Examples of the known prior art include those having a modular structure (see Patent Document 1, for example) in which an n-type semiconductor element and a p-type semiconductor element are alternately disposed on a substrate and adjacent semiconductor elements are interconnected by means of an electrode and those having a modular structure (see Patent Document 2, for example) in which a plurality of semiconductor elements of the same conductivity type are provided to form a predetermined array, and further, the electrodes positioned on double faces of these semiconductor elements are formed to be connected to each other by means of a lead wire. In either of these structures, an arrangement, in which a plurality of platy semiconductor elements is arrayed in a planar manner in a state in which they are horizontally laid down, is formed as a base.

Patent Document 1: Japanese Patent Application No. 7-211944
Patent Document 2: Brochure of International Application Publication 05/124881

DISCLOSURE OF THE INVENTION

Problem(s) to be Solved by the Invention

Incidentally, in those having the latter modular structure in which electrodes of the semiconductor elements of the same conductivity type are interconnected via the lead wire, single elements of the same material are serially mounted on a substrate, whereby a contrivance is made for an element structure, thereby attempting to improve thermoelectric conversion efficiency. However, owing to its structure in which a plurality of sintered compacts made of composite-metal oxides are affixed onto the substrate on one-by-one compact basis, a connection between the element and the lead wire is prone to be improper. An improper connection may cause a continuity failure.

The present invention has been made in view of the aforementioned circumstance, and aims to provide a thermoelectric conversion module and a connector for thermoelectric conversion element, which are free of a continuity failure and are high in electrical reliability.

Means for Solving the Problem

In order to solve the aforementioned problem, a thermoelectric conversion module, in which a thermoelectric conversion element is arranged on a substrate and an electrode formed on the thermoelectric conversion element and another electrode different therefrom are electrically connected to each other via a conductive connector formed in a predetermined shape, is characterised by the connector comprising a first fitted portion engagingly mounted to the electrode of the thermoelectric conversion element and a connector lead portion which is electrically connected to the first fitted portion and another electrode.

In the present thermoelectric conversion module, the conventional connector, in which a connection lead wire and a fitted portion are integrated with each other, is employed, so that reliable continuity is obtained, and electrical reliability is improved. Namely, a connector is used such that the lead wire is integrally incorporated in place of the conventional connection lead wire, the electrode of the thermoelectric conversion element and another electrode are electrically connected to each other by means of this connector, and therefore, the thermoelectric conversion module can be provided which is free of a continuity failure and which is high in electrical reliability.

In the abovementioned configuration, the "thermoelectric element" denotes an element for converting thermal energy and electrical energy to each other by utilizing the Seebeck effect or Peltier effect, and includes all of conventionally known structures (constitutions). In the abovementioned configuration, further, the connector can be made of silver, brass, or SUS, which is corrosion-retardant in a high-temperature oxidization atmosphere. Furthermore, in the abovementioned configuration, any number of electrodes of the thermoelectric conversion element may be employed. Still furthermore, in the abovementioned configuration, for example, the "remaining electrode" may be an electrode of another thermoelectric conversion element on a same substrate, or alternatively, may be an external electrode to which the thermoelectric conversion module is electrically connected.

The thermoelectric conversion module may be further characterised in that the thermoelectric conversion element has a main face of surface area is the largest and the electrodes are positioned on both sides of the main face, respectively, and the main face is disposed to be longitudinally erected so as to be substantially perpendicular to the substrates. Further, the thermoelectric conversion element may be arranged in a longitudinally erected state, whereby the dimensions in the vertical direction of the thermoelectric conversion element is increased; an element resistance is increased; a current is restrained; and a temperature difference between both ends of the element is readily taken, thus allowing an electromotive force to rise and high thermoelectric conversion efficiency to be obtained (refer to embodiments described later for detail). In the abovementioned configuration, the shape of the thermoelectric conversion element can be arbitrarily selected from a rod-like shape or a polyhedron shape including a rectangular cross section (such as a rectangular solid). In other words, any shape may be formed such that the conversion element has: a main face of which surface area is the largest; and an electrodes which are positioned at one sides of the main face, respectively, and further, the electrodes are brought into contract with the substrate, and the main face can be disposed to be longitudinally erected so as to be substantially perpendicular to the substrate.

The thermoelectric conversion module may be further characterised in that the connector is prefixed in a predetermined array on the substrate. Further, the connector may be prefixed in the predetermined array on the substrate, so that the thermoelectric conversion module can be produced merely by engagingly attaching the thermoelectric conversion element to the first fitted portion of the connector and inconvenience in assembling (manufacturing process) can be alleviated (assembling property is improved).

In the abovementioned configuration, it is preferable that the connector be formed by a conventional metal employed for lead wires, and the mount width of the first fitted portion of the connector be set to be smaller than a width of the electrode of the thermoelectric conversion element. By doing this, when the thermoelectric conversion element is pushed against, and is engaged with, the first fitted portion of the connector, the first fitted portion is elastically pushed and broadened, the electrode of the thermoelectric conversion element is mounted to the first fitted portion of the connector in a "one-touch" fashion, and the thermoelectric conversion element and the connector can be bonded to each other in a gapless manner, according to the characteristics of a metal used for lead wires. Advantageously, a continuity failure or a contact failure never arises between the thermoelectric conversion element and the connector. Further, in the configuration in which the mount width of the first fitted portion of the connector is thus set to be smaller than the width of the electrode of the thermoelectric conversion element, it is preferable that the first fitted portion be formed by a pair of bending pieces and that the rims at both ends of each of the bending pieces be formed in a tapered shape. By doing this, the thermoelectric conversion element is slidably pushed into the first fitted portion along the tapered shape from the rims at both ends of the bending piece, whereby the bending piece is elastically pushed and broadened smoothly, and the thermoelectric conversion element is readily attached to the connector in addition to the aforementioned advantageous effect.

The thermoelectric conversion module may be further characterised in that the electrode of the thermoelectric conversion element is made up of a pair of first and second electrodes which are positioned at both sides of the thermoelectric conversion element, and the thermoelectric conversion element is sandwiched between a first substrate, which is opposed to the first electrode, and a second substrate, which is opposed to the second electrode. The thermoelectric conversion element is fixed so as to apply a pressure in a double-door manner while the thermoelectric conversion element is sandwiched between a pair of substrates, so that a contact area between the electrode and the connector, of the thermoelectric conversion element, increases. Thus, a continuity failure or a contact failure can be reduced, and electrical reliability can be improved. It is preferable that a substrate be employed in which stainless (SUS) or the like is deposited on an insulating substrate such as an alumina substrate by means of PVD (Physical Vapor Deposition), thereby imparting insulation property. This can prevent short-circuit exerted by an electrical factor of the connectors that are prefixed in the predetermined array.

The thermoelectric conversion module may be further characterised in that another element is an external element to which the thermoelectric module is electrically connected.

The advantageous effect is attained and a connection to an external electrode can be readily and reliably performed by means of the connector, excellent assembling property for another device is obtained, and electrical reliability can be improved. Namely, an electrical connection between the thermoelectric conversion module and an external device (such as another module) is made merely by engaging the first fitted portion with the thermoelectric conversion element and connecting the connector lead portion to the external device, thus improving assembling property.

The thermoelectric conversion module may be further characterised in that the first fitted portion has a guide portion which guides attachment of the thermoelectric conversion element and which is bendable as it were along the thermoelectric conversion element after the thermoelectric conversion element is attached to the first fitted portion. The advantageous effect is attained and the first fitted portion has the guide portion, whereby the thermoelectric conversion element is readily attached to the connector (in particular, advantageous effect becomes significant if the mount width of the first fitted portion of the connector is set to be smaller than the width of the electrode of the thermoelectric conversion element), so that assembling efficiency thereof can be improved. Further, the guide portion is bendable as if it were along the thermoelectric conversion element, whereby the thermoelectric conversion element can be fixed at the guide portion after the thermoelectric conversion element is attached to the connector, and the attachment stability of the thermoelectric conversion element in the connector can be improved. Therefore, the thermoelectric conversion module can be provided which is free of a continuity failure and which is high in electrical reliability.

The thermoelectric conversion module may be further characterised in that the first fitted portion is bendable, and has a short-circuit piece having a sufficient length to electrically come into contract with a connector which is adjacent thereto when the fitted portion is bent.

The advantageous effect is attained, and the first fitted portion has the short-circuit piece, whereby, even if a continuity failure arises between the connectors due to damage of the thermoelectric conversion element per se or due to degradation thereof, the continuity between the connectors becomes conductive due to the short-circuit piece, thereby making it possible to repair the faulty element.

The thermoelectric conversion module may be further characterised in that the connector lead portion has a second fitted portion engagingly mounted to another electrode in another thermoelectric conversion element arranged on the substrate.

According to the thermoelectric conversion module of claim 8, advantageous effect is attained which is similar to that of the thermoelectric conversion module of any one of claims 1 to 7, and the connector lead portion has the second fitted portion engagingly mounted to another electrode in another thermoelectric conversion element arranged on the substrate, so that the thermoelectric conversion elements can be electrically connected to each other by means of the connector on the substrate. Namely, the connector is used such that the lead wire is integrally incorporated, in place of the conventional connection lead wire, and thereafter, the electrodes of the thermoelectric conversion element are electrically connected to each other by means of this connector, so that the thermoelectric conversion module can be provided which is free of a continuity failure and which is high in electrical reliability.

The thermoelectric conversion module may be further characterised in that the connector lead portion has a parallel portion which extends from the electrode face on a side face between electrode faces of the thermoelectric conversion element.

The advantageous effect is attained and the connector lead portion has the parallel portion, whereby the contact area between the connector lead portion and the thermoelectric conversion element increases; the thermoelectric conversion element can be retained in a larger area, and the attachment stability of the thermoelectric conversion element in the connector can be improved.

The thermoelectric conversion module may be further characterised by comprising a fixing member which can be inserted into both sides of the thermoelectric conversion element and which has electrically insulating comb teeth. The advantageous effect is attained and the fixing member having the comb teeth is provided, whereby comb teeth are inserted into both ends of one or plural thermoelectric conversion elements, the thermoelectric conversion element is supported by the comb teeth as well, and the attachment stability of the thermoelectric conversion element in the module can be improved. It is preferable that the fixing member have electrical insulation property in order to prevent short-circuit. For example, if the fixing member is attached to the cooling face side (low-temperature side), anodized-aluminum treatment is applied to the fixing member, and if the fixing member is attached to the heating face side (high-temperature side), it is preferable that stainless (SUS) is deposited onto the fixing member by means of the PVD (Physical Vapor Deposition) or that glass coating be applied.

The thermoelectric conversion module may be further characterised in that a predetermined array is formed by providing a plurality of the thermoelectric conversion elements in parallel on the substrate, and the connector includes: a first connector for electrically connecting a plurality of thermoelectric conversion elements in the array; and a second connector for electrically connecting an electrode of a first or last thermoelectric conversion element in the array, which is connected to the first connector, and another electrode.

The advantageous effect is attained and a longitudinal thermoelectric conversion element can be modeled with good connectivity and with high efficiency with the use of the connector. Further, the connector can be selectively used according to the connection mode of the thermoelectric conversion element, thus making it possible to achieve the thermoelectric conversion element array of various modes according to usage.

The thermoelectric conversion module may be further characterised in that another electrode to which the second connector is connected is an electrode of the thermoelectric The advantageous effect is attained, and the plurality of arrays can be electrically connected to each other by means of the connector, so that the thermoelectric conversion element array of various modes according to usage can be implemented.

The thermoelectric conversion module may be further characterised in that the electrode of the thermoelectric conversion element is made up of a pair of first and second electrodes which are positioned at both ends of the thermoelectric conversion element; either one of the first and second electrodes is defined as a heating face; another one is defined as a cooling face; and electric power is generated due to a temperature difference between the heating face and the cooling face.

The advantageous effect is attained, and the thermal energy absorbed from the substrate can be converted to electrical energy by heating the substrate, and thereafter, cooling the cooling face of the thermoelectric conversion element.

The thermoelectric conversion module may be further characterised in that the thermoelectric conversion element is a sintered compact including composite-metal oxide.

The advantageous effect is attained, and the thermoelectric conversion element is comprised of a sintered compact of a composite-metal substance, whereby heat resistivity or dynamic rigidity can be improved. The thermoelectric conversion module may be further, characterised in that the composite-metal oxide includes an alkaline earth metal, a rare-earth element, and manganese as constituent elements.

The advantageous effect is attained and the oxide of the composite-metal elements is defined as oxide consisting of the alkaline earth metal, the rare-earth element, and manganese, thereby making it possible to improve heat resistivity at a high temperature more remarkably.

It is preferable to employ calcium as an alkaline earth metal, and it is preferable to employ yttrium or lanthanum as a rear-earth element. Specifically, it is further preferable that perovskite-type $CaMnO_3$-based composite oxide be represented by chemical formula $Ca_{(1-x)}M_xMnO_3$ (wherein M is yttrium or lanthanum and $0.001 \leq x \leq 0.05$).

The thermoelectric conversion module may be further characterised in that each of the thermoelectric conversion elements is made of a same material. The advantageous effect is attained and the thermoelectric conversion elements are comprised of a same material (same size, same shape, and same material (such as semiconductor of same conductivity type, for example), whereby electrical characteristics of the thermoelectric conversion elements can be uniformed. As the result thereof, the thermoelectric conversion efficiency can be improved in comparison with that of the conventional thermoelectric conversion module in which the elements of different conductivity types are alternately disposed.

The thermoelectric conversion module may be further characterised in that the electrodes of the thermoelectric conversion element are made of a pair of a first electrode and a second electrode which are positioned at both sides of the thermoelectric conversion element; one connector having a first fitted portion to be engaged with the first electrode and another connector having a second fitted portion to be engaged with the second electrode are adjacent to each other to oppose the fitted portions to each other so that the thermoelectric conversion element can be inserted; and a distance between the first fitted portion of such one connector and the second fitted portion of another connector in a state in which the thermoelectric conversion element is not mounted is set to be shorter than a distance between the first and second electrodes in the thermoelectric conversion element. The advantageous effect is attained, and, when the thermoelectric conversion element is engaged with the connector formed in the substantially U-shape and narrowed at a tip end, the tip end of the fitted portion is pushed and broadened, and then, the thermoelectric conversion element is engaged. In this manner, the tip end of the fitted portion compresses the thermoelectric conversion element, so that the thermoelectric conversion element can be reliably maintained by means of the connector. Further, when the thermoelectric conversion element is attached, the fitted portions that are opposite to each other are substantially parallel thereto, and, in the thermoelectric conversion module, a contact area between the electrode and the fitted portion at each of the connectors can be uniformed. As the result thereof, thermoelectric efficiency can be improved.

The thermoelectric conversion module may be further characterised in that the first fitted portion or the second fitted portion has a hook-like fitted portion to be engagingly fitted with a fixing groove of the thermoelectric conversion element.

The advantageous effect is attained and the fitted portion of the connector is engagingly fitted with the fixing groove of the thermoelectric conversion module, whereby the thermoelectric conversion element is rigidly attached to the connector, so that attachment stability thereof can be improved, and further, the thermoelectric conversion module can be provided which is free of a continuity failure and which is high in electrical reliability.

In the present invention, the aforementioned connector for thermoelectric connector, having the characterizing feature, is also provided.

Advantageous Effect(s) of the Invention

According to the present invention, a thermoelectric conversion module and a connector for thermoelectric elements can be provided which are free of a continuity failure and are high in electrical reliability because thermoelectric conversion elements are electrically interconnected by means of a connector having a fitted portion integrated with a conventional connection lead wire.

BEST MODE FOR CARRYING OUT THE INVENTION

Hereinafter, one embodiment of the present invention will be described with referring to the drawings. The Inventor studied a composition of a thermoelectric conversion element and a shape thereof, for the purpose of further high yielding of the thermoelectric conversion element. First, the contents of the mixing pot was mixed by adding $CaCO_3$, $MnCo_3$, and $Y_2O_3$, and further, adding pure water into a mixing pot in which milled balls had been entered, attaching this mixing pot to a vibration ball mill, and thereafter, vibrating them for 2 hours. Next, the obtained mixture was filtered and dried, and then, the mixture after dried was temporarily fired at 1000 degrees Celsius and for 5 hours. Next, a binder was added to the milled substance after dried, and the added binder was dried, and then, was granulated after sizing it. After that, the obtained granules were molded by means of a pressing machine, and the obtained molded compact was regularly fired for 5 hours. In this manner, a $CaMnO_3$-based thermoelectric conversion element was obtained as a sintered compact.

In the abovementioned method, seven types of samples of which x was defined as 0, 0.003, 0.006, 0.0125, 0.025, 0.05, and 0.10 in $Ca_{1-x}Y_xMnO_3$ was fabricated, and thereafter, in the manufacture of the respective samples, the regular firing temperature was varied to 1,100 degrees Celsius, 1,200 degrees Celsius, and 1,300 degrees Celsius. Further, a flat-plate sample of about 8 mm in square and about 2.5 mm in thickness and a rod-like sample of about 2.5 mm×about 3 mm in cross section and about 8 mm in length were prepared as samples.

A resistivity $\rho$ and the Seebeck coefficient $\alpha$ were measured with respect to the flat-plate sample and the rod-like sample thus obtained by varying the regularly firing temperature as to the compositions of the seven types. The resistivity $\rho$ was measured in accordance with a four-terminal approach using a digital voltmeter, and further, the Seebeck coefficient $\alpha$ were measured by means of a measuring instrument A shown in FIG. 1. The results are shown in FIGS. 2 and 3. In the measuring instrument A shown in FIG. 1, a sample 8 was sandwiched between a pair of copper plates 6, 6 disposed on a hot plate 2 via an aluminum plate 4, and further, a heat sink 10 was disposed on the copper plate 6 which had been upwardly provided. Moreover, a digital voltmeter 12 and a thermoelectric couple 14 were connected to the pair of copper plates 6, 6, respectively, and further, the thermoelectric couple 14 was connected to a digital thermometer 16.

The resistivity $\rho$ of the flat-plate sample was obtained as shown in FIG. 2, and the Seebeck coefficient $\alpha$ of the flat-plate sample was obtained as shown in FIG. 3. As shown in FIGS. 2 and 3, the higher the regular firing temperature was and the greater "x" in the above composition was, the lower resistivity $\rho$ and Seebeck coefficient $\alpha$ were, either. Further, an output factor PF ($=S^2/\rho$) was found from the obtained resistivity $\rho$ and Seebeck coefficient $\alpha$. The result is shown in FIG. 4. As is evident from FIG. 4, in a case where "x" in the above composition ranges from 0.003 to 0.1 and the regular firing temperature is 1200 degrees Celsius, an output factor was obtained which is higher than a value obtained in the literature [$(Ca_{0.9}Bi_{0.1})MnO_3$ M. Ohtaki et. J. Solid state. chem. 120 (1995)]. Further, in a case where "x" in the above composition is 0.0125 and the regular firing temperature is 1,300 degrees Celsius, the output factor was $4.02\times10^{-4}$ W/m $K^2$, which is the highest.

Further, the resistivity $\rho$ of the rod-like sample was obtained as shown in FIG. 5, and the Seebeck coefficient $\alpha$ of the rod-like sample was obtained as shown in FIG. 6. As shown in FIGS. 5 and 6, tendency associated with an increase of "x" in the above composition was identical to that of the flat-plate sample. Furthermore, the rod-like sample was greater in Seebeck coefficient $\alpha$. An output factor RF ($=S_2/\rho$) was found from the obtained resistivity $\rho$ and Seebeck coefficient $\alpha$. The result is shown in FIG. 7. As is evident from FIG. 7, in a case where "x" in the above composition is 0.025 and the regular firing temperature is 1,300 degrees Celsius, an output factor was obtained which is on the order of seven times higher than the value obtained in the literature [$(Ca_{0.9}Bi_{0.1})MnO_3$ M. Ohtaki et. J. solid state. chem. 120 (1995)] and $8.85\times10^{-4}$ W/m $K^2$.

As set forth above, it was found that the rod-like element has a higher output factor. Thus, it is considered to be preferable to fabricate a thermoelectric conversion module with the use of the rod-like element. Hereinafter, the thermoelectric conversion module using the rod-like element will be discussed.

The Inventor previously filed an application for the thermoelectric conversion module using the platy electrode, and this application was already disclosed (Brochure of International Application Publication 05/124881). In the invention described in this publication, the sectional area of an element is reduced in order to minimally restrain thermal transfer due to a lead wire connected to the element, and thus, there is a need to lowly restrain an allowable current. In such module, therefore, if a temperature difference is 200 degrees Celsius or greater, a current value becomes 10 A or more, and it is considered that a lead wire is thereby affected.

As a solution to this, the Inventor found out that, by using the rod-like element having the high output factor, as set forth above, the element resistance is increased in the thermoelectric conversion module, making it possible to restrain a current. Further, the Inventor found out that, as described later, by providing a longitudinal element, a voltage can be increased, since a temperature difference can be readily taken, and output density can be increased by setting a thermal resistance at an appropriate value.

In this regard, at first, the influence upon a temperature difference due to a length of an element will be explained with referring to FIG. 8. A temperature difference at both ends of an element when heat is transferred to the element is determined depending upon a heat source temperature, a cooling temperature, or a thermal resistance at the time of heat infusion to or heat dissipation from the element, apart from thermal conductivity of the element or a length thereof. In other words, as shown in FIG. 8, if an element 20 is sandwiched between a pair of support plates 22 and 24, a heat source temperature "Th" is lowered to T1 due to a thermal resistance R1 at the time of thermally transmitting one of the support plates 22; is lowered to T2 at the time of transmitting the element 20; and further, is lowered to Tc due to a thermal resistance R2 at the time of thermally transmitting the other one of the support plates 24.

In this case, a calorific value Q at the time of thermally transmitting the support plates 22, 24 and the element 20 is represented by Formula (1) below.

$$Q=\{(Th-Tc)/(R1+1/k+R2)\}S \quad \text{Formula (1)}$$

Wherein, k denotes thermal conductivity; l denotes the length of an element 20; and S denotes a sectional area.

Therefore, a temperature difference T1−T2 at both ends of the electrode 20 is represented by Formula (2) below.

$$T1-T2=Q/S(1/k)=\{(Th-Tc)(1/k)\}/(R1+1/k+R2) \quad \text{Formula (2)}$$

Using this formula (2), a temperature difference with respect to the length of the element 20 was found. A condition for obtaining the difference was set as follows. That is, Th=500 degrees Celsius was set; Tc=20 degrees Celsius was set; the thermal conductivity of the element 20 was set at 2.0 W/m K; and the thermal resistances R1, R2 were varied in the range of 0.0001 to 0.01 m²/W K. Further, the length of the element 20 ranged from 0.1 cm to 3.0 cm. The result is shown in FIG. 9. As is evident from FIG. 9, the greater length of the element is, the greater temperature difference is; and the smaller thermal resistance is, the smaller temperature difference is. Further, where the thermal resistance was set at 0.0001 m²/W K, the length of the element was set at 0.2 cm and the temperature difference of about 400 degrees Celsius was obtained, whereas, the resistance was set at 0.01 m²/W K and the length of the element was set at 0.2 cm, only the temperature difference of about 23 degrees Celsius was obtained. In view of this result, it is found to be necessary to minimize the thermal resistance in order to increase the temperature difference.

Next, the influence associated with the maximum output exerted by the length of the element will be explained.

The exerted maximum output "Pmax" of the thermoelectric conversion element is represented by Formula (3) below, in accordance with a thermal electromotive force V and an electrical resistance R of the element.

$$P\text{max}=(V^2/R)/4 \quad \text{Formula (3)}$$

Further, the thermal electromotive force is represented by Formula (4) below in accordance with the Seebeck coefficient α and a temperature difference ΔT of the thermoelectric conversion element.

$$V=\alpha\Delta T \quad \text{Formula (4)}$$

Since the temperature difference ΔT is dependent upon the length of the element as described above, the exerted maximum output in the formula was calculated with respect to the length of the element. In this case, the Seebeck coefficient of the thermoelectric conversion material was set at 250 μV/K; the resistivity was set at 0.015 Ωcm; the thermal conductivity was 2.0 W/m K; and the sectional area of the element was set at 1.0 cm². The thermal resistances R1 and R2 were varied in the range of 0.0001 to 0.01 m²/W K. The result is shown in FIG. 10. As is evident from FIG. 10, the exerted maximum output varies depending upon the length of the element, and the length of the element is maximized by the value of the thermal resistance. Further, it is found that, when the maximum output is obtained, the smaller thermal resistance is, the shorter the length of the element is. Furthermore, when the thermal resistance was set at 0.005 m²/W K, the length of the element was set at 2.0 cm, and the thermal resistance was set at 0.001 m²/W K, the length of the element was obtained to be 0.4 cm. Therefore, in a case where the thermal resistance is within the range of 0.001 m²/W K to 0.005 m²/W K, it is considered to be appropriate that the length of the element be set in the range of 0.4 cm to 2.0 cm.

Next, output characteristics due to variation of the element shape will be explained.

A platy element (sectional area: 8 mm×8 mm, height: 2 mm) and a rod-like (longitudinal) element (sectional area: 8 mm×2 mm, height: 8 mm) was investigated with respect to a voltage, a current, and the exerted maximum output. The result is shown in FIG. 11. In this case, the heat source temperature was set at 500 degrees Celsius; the Seebeck coefficient α of the thermoelectric conversion material was set at 250 μV/K; the resistivity was set at 0.015 Ωcm; and the thermal conductivity was set at 2.0 W/m K.

As is evident from FIG. 11, because the rod-like element has a greater resistance, an open-circuit voltage is high and the short-circuit current is low. Further, when the thermal resistance was set at 0.005 m²/W K, the output density of the rod-like element was greater than that of the platy element.

As set forth above, it was found that the rod-like element is preferable in view of the output of the thermoelectric conversion element. Because of this, the Inventor found out the necessity of arraying the thermoelectric conversion element in its erected state in order to implement such rod-like element and invented a connector that can be properly and efficiently connected and modeled in a state in which a plurality of thermoelectric conversion elements are erected. Hereinafter, the above-modeled connector will be explained in detail. In FIG. 17, there is shown a thermoelectric conversion module M according to one embodiment of the present invention, which was constituted so that a plurality of thermoelectric conversion elements 30 are electrically connected in predetermined arrays with the use of three types of first to third connectors C1, C2, C3 for thermoelectric conversion elements. As illustrated, the arrays of the thermoelectric conversion elements 30 include first to fourth arrays A1, A2, A3, A4, which are adjacent to one another and which extend in parallel. In FIG. 17, further, seventeen thermoelectric conversion elements 30 are serially connected for each of the arrays A1, A2, A3, and A4, and the arrays A1 to A4 are also serially connected.

Each of the thermoelectric conversion elements constituting a thermoelectric conversion module M serves to mutually convert thermal energy and electrical energy by utilizing the Seebeck effect and the Peltier effect, and is made of the same material. In other words, the thermoelectric conversion elements 30 are equally defined in size (for example, about 2.5 mm×about 3 mm in cross section and about 8 mm in length), shape, and material (such as a semiconductor of the same conductivity type). Specifically, in the present embodiment, each of the thermoelectric conversion elements 30 is a sintered-compact cell made of a composite-metal oxide, and includes constituent elements, alkaline earth metal, rare-earth element, and manganese. In particular, in the present embodiment, $CaMnO_3$-base element is used as each of the thermoelectric conversion elements 30. In the present embodiment, an n-type semiconductor is employed as the thermoelectric conversion element 30 without being limitative thereto. As shown in FIG. 18, further, each of the thermoelectric conversion elements 30 is shaped in a rectangular prism, and has: a pair of opposed main faces 30a, 30b of the largest sectional area; the first and second electrodes 30c, 30d, which are positioned, respectively, at both sides of each of these main faces 30a, 30b (hereinafter, referred to as first and second electrode faces, since they form planes); and another two side faces 30f, 30e. In this case, one of the first and second electrode faces 30c, 30d is defined as a heating face, and the other one is defined as a cooling face, so that electric power is generated due to a temperature difference between the heating face and the cooling face. The side faces 30f, 30e may be employed as electrode faces. Further, each of the thermoelectric conversion elements 30 may be formed in a rod-like shape, in particular, in a columnar shape, without being limitative to the rectangular shape. In that case, a top face and a bottom face of the column are formed as the electrode faces, and a side face is formed as a main face. In the present embodiment, further, the arrays A1 to A4 of the thermoelectric conversion element 30, as is clearly shown in FIG. 19, are sandwiched between a first substrate 90, which is opposed to a first electrode face 30c of each of the thermoelectric conversion element 30, and a second substrate 91, which is opposed to a second electrode face 30d of each of the thermoelectric conversion elements 30. In this case, each of the thermoelectric conversion elements 30 is disposed in a longitudinally erected manner so that electrode faces 30c, 30d are brought into contact with the substrates 90, 91 via connectors C1, C2, C3 and so that the main faces 30a, 30b are substantially perpendicular to the substrates 90, 91. As is clearly shown in FIG. 17, in the thermoelectric conversion elements 30, which are adjacent to each other, a first electrode face ("one electrode") 30a of one of the elements 30 and a second electrode face ("the other electrode") 30b of the other electrode are electrically connected via connectors C of a predetermined shape. Such connectors C are made up of: a first connector C1 (see FIG. 13) of a substantially U-shape (a first shape), for electrically connecting the thermoelectric conversion elements 30 in each of the arrays A1 to A4; and a second connector C2 (see FIG. 14) of a substantially S-shape (a second shape), for electrically connecting one thermoelectric conversion element 30 in one of the arrays A1, A2 (A2, A3; A3, A4) that are adjacent to each other. In addition, in the thermoelectric conversion module M, there also exists a further second connector (subsequently, a third connector C3 (C3a, C3b)), for electrically connecting: a first thermoelectric conversion element 30A and a last thermoelectric conversion element 30B of the entire array; and an external electrode ("the other electrode" not shown). (See FIGS. 15 and 16.) The connectors C1, C2, C3 can be made of a material such as silver, brass, or SUS, which is corrosion-retardant even in a high-temperature oxidization atmosphere.

As shown in FIG. 12A and FIG. 13, the first connector C1 has: a first fitted portion 40, which is engagingly mounted to a first or second electrode face ("electrode") 30c, 30d of one of the thermoelectric conversion elements 30 arranged on the substrates 90, 91; and a connector lead portion 45, for electrically connecting the first fitted portion 40 to "the other electrode". Further, the connector lead portion 45 is made up of: a second fitted portion 42, which is engagingly mounted to the first or second electrode face 30c, 30d as "the other electrode", which was mentioned above, of the other one of the thermoelectric conversion elements 30 arranged on the substrates 90, 91; and a connection portion 44 for connecting the second fitted portion 42 and the first fitted portion 40. Further, at both ends, each of the fitted portions 40, 42 has bending pieces "e" for sandwiching end rims at the main faces 30a, 30b in a double-door manner. Further, tapered portions 47, each of which is obliquely cut out, are provided at the rims at both ends of each of the bending pieces "e". In the present embodiment, the first connector C1, which was cut out from a platy member in an exploded state shown in FIG. 12A, is bent at substantially 90 degrees at a boundary portion between the fitted portion 40, 42 and the connection portion 44, and the bending pieces "e" at both ends of the fitted portion 40, 42 are bent at substantially 90 degrees or more, whereby a use aspect of the substantial U-shape shown in FIG. 13 can be obtained. For example, if the first fitted portion 40 is engaged with the first electrode face ("electrode") 30c of one of the thermoelectric conversion elements 30, 30 that are adjacent to each other in the same array, and further, the second fitted portion 42 is engaged with the second electrode face ("the other electrode") 30d of the other one of the adjacent thermoelectric conversion elements 30, 30, the connection portion 44 is longitudinally obliquely oriented, and then, the thermoelectric conversion elements 30, 30, which are adjacent to each other, are electrically connected. In this case, as shown in FIG. 17, the first connector C1 is mounted so that the connection portions 44 are obliquely oriented in the same direction in the same array of the thermoelectric conversion element 30, and is mounted so that the connection portions 44 are oppositely oriented between the adjacent arrays (for example, the oblique direction of the connection portions 44 in the first array A1 are opposite to that of the connection portions 44 in the second array A2). Further, all of the connection portions 44 are positioned at the same side with respect to the main faces 30a, 30b in the same array, whereas they are opposed between the adjacent arrays. In other words, the connection portions 44 are positioned at the appropriate sites of the side face 30e in the first array A1, whereas the connection portions 44 are positioned at the appropriate sites of the side face 30f in the second array A2.

Here, by bending and inclining the bending piece "e" at 90 degrees or more, a mount width W1 (see FIG. 13B of the fitted portion 40, 42 of the first connector C1 is set to be smaller than a width W2 (see FIG. 18) of the electrode face 30c, 30d of the thermoelectric conversion element 30. By doing so, when the thermoelectric conversion element 30 is pushed against, and is engaged with, the fitted portion 40, 42 of the first connector C1, the fitted portion 40, 42 (bending piece "e") is elastically pushed and broadened, whereby the electrode faces 30c, 30d of the thermoelectric conversion element 30 can be mounted to the fitted portions 40, 42 of the connector C1 and the thermoelectric conversion element 30 in a one-touch manner and the connector C1 can be bonded in a gapless manner. Advantageously, a continuity failure or a contact failure never arises between the thermoelectric conversion element 30 and the connector C1. In particular, in the present embodiment, tapered portions 47, which were obliquely cut out, are provided at the rims at both ends of each of the bending pieces "e", so that, as shown in FIG. 20, the thermoelectric conversion element 30 can be pushed into the fitted portion 40, 42 while it is slid along the tapered shape from the rims at both ends of each of the bending pieces "e". Further, the bending pieces "e" can be thereby pushed and broadened elastically smoothly, thus facilitating attachment of the thermoelectric conversion element 30 to the first connector C1.

As shown in FIG. 12B and FIG. 14, further, the second connector C2 has: a first fitted portion 50, which is engagingly mounted to the first or second electrode face ("one electrode") 30c, 30d of one thermoelectric conversion element 30, which is arranged on the substrate 90, 91; and a connector lead portion 55 for electrically connecting the first fitted portion 50 to "another electrode". Further, the connector lead portion 55 is made up of: a second fitted portion 52, which is engagingly mounted to the first or second electrode face 30c, 30d as "another electrode", which was mentioned above, of another thermoelectric conversion element 30 arranged on the substrate 90, 91; and a connection portion 54, for connecting the first fitted portion 52 and the first fitted portion 50. Further, at both ends, the fitted portions 50, 52 have bending pieces "e" for sandwiching the end rims at the main faces 30a, 30b in a double-door manner. Furthermore, the tapered portions 57, which were obliquely cut out, are provided at the rims at both ends of each of the bending pieces "e". Moreover, in the present embodiment, the second connector C2, which was cut out from a platy member in an exploded state shown in FIG. 12B, is bent at substantially 90 degrees at the boundary portion between the fitted portion 50, 52 and the connection portion 54, and the bending pieces "e" at both ends of the fitted portion 50, 52 are bent at 90 degrees or more, whereby a use aspect of a substantial U-shape shown in FIG. 14 can be obtained. For example, if the first fitted portion 50 is engaged with the first electrode face ("electrode") 30c (or the second electrode face 30d) of one thermoelectric conversion element 30, which is positioned at an end part of one of the arrays A1, A2, (A2, A3; A3, A4) that are adjacent to each other, and the second fitted portion 52 is engaged with the second electrode face ("another electrode") 30d (or the first electrode face 30c) of another thermoelectric conversion element 30, which is positioned adjacent to the end part of another one of the adjacent arrays, the connection portion 54 is positioned so as to be sandwiched between these adjacent thermoelectric conversion elements 30 and these thermoelectric conversion elements 30, 30 are electrically connected to each other.

In the case of this second connector C2 as well, by bending and inclining the bending piece "e" at 90 degrees or more, the mount width W1 (see FIG. 14B) of the fitted portion 50, 52 of the connector C2 is set to be smaller than the width W2 (see FIG. 18) of the electrode face 30c, 30d of the thermoelectric conversion element 30. Therefore, when the thermoelectric conversion element 30 is pushed against, and is engaged with, the fitted portion 50, 52 of the second connector C2, the fitted portion 50, 52 (bending piece "e") is elastically pushed and broadened, and the thermoelectric conversion element 30 and the connector C2 can be bonded in a gapless manner. Advantageously, a continuity failure or a contact failure never arises between the thermoelectric conversion element 30 and the connector C2. In particular, in the present embodiment, the tapered portions 57, which were obliquely cut out, are provided at the times of both ends of each of the bending pieces "e". Thus, like the first connector C1, the thermoelectric conversion element 30 can be pushed into the fitted portion 50, 52 while it is slid along the tapered shape from the rim side of the both ends of the bending piece "e", and the bending piece "e" can be thereby pushed and broadened elastically smoothly, thus facilitating attachment of the thermoelectric conversion element 30 to the second connector C2.

As shown in FIG. 12C, further, the third connector C3 has: a first fitted portion 60, which is engagingly mounted to the first electrode 30c (or the second engagement face 30d) of the thermoelectric conversion element 30; and a connector lead portion 64, which longitudinally extends from an end part of the first fitted portion 60 and electrically connected to an external electrode. At both ends, the fitted portion 60 has bending pieces "e" for sandwiching end rims at the main face 30a (30b) in a double-door manner. Further, tapered portions 67, which were obliquely cut out, are provided at the rims at both ends of each of the bending pieces "e". There are two types of the third connector C3: a connector C3a (see FIG. 15) for electrically connecting a first thermoelectric conversion element 30A (see FIG. 17) of the entire array and an external electrode ("another electrode" not shown); and a connector C3b (see FIG. 16) for electrically connecting a last thermoelectric conversion element 30B (see FIG. 17) of the entire array and an external electrode (not shown). Both of these connectors C3a, C3b are formed from the connector C3 that was cut out from a platy member in an exploded state shown in FIG. 12C. In other words, in the present embodiment, if the third connector C3, which was cut out from a platy member in an exploded state shown in FIG. 12C, is bent at substantially 90 degrees at the boundary portion between the fitted portion 60 and the connector lead portion 64, and the bending portions "e" at both ends of the fitted portion 60 and is bent at substantially 90 degrees at an intermediate portion 69 of the connector lead portion 64, and further, the bending pieces "e" at both ends of the fitted portion 60 are bent at 90 degrees or more, the connector C3a for electrically connecting a first thermoelectric conversion element 30A of the entire array and an external electrode ("another electrode" not shown) can be obtained as shown in FIG. 15. On the other hand, if the third connector C3a, which was cut out from a platy member in the exploded state shown in FIG. 12C, is bent at substantially 90 degrees at the boundary portion between the fitted portion 60 and the connector lead portion 64, and further, the bending pieces at both ends of the fitted portion 60 are bent at 90 degrees or more, the connector C3b for electrically connecting a last thermoelectric conversion element 30B of the entire array and an external electrode ("another electrode" not shown) can be obtained as shown in FIG. 16. After that, if the fitted portion 60 of the connectors C3a and C3b is engaged with the first or second electrode face 30c (30d) of the first and last thermoelectric conversion electrodes 30A, 30B of the entire array, and further, the connector lead portion 64 is connected to the external electrode, the thermoelectric conversion module M and the external device (or external element, external circuit) are electrically connected. In the case of this third connector C3 as well, by bending and inclining the bending pieces 90 "e" at 90 degrees or more, the mount width W1 (see FIG. 15B) of the fitted portion 60 of the connector C3 is set to be smaller than a width W2 (see FIG. 18) of the electrode face 30c, 30d of the thermoelectric conversion element 30. As one aspect of the present embodiment, each of the connectors C1, C2, C3 is prefixed in a predetermined array on the substrate 90 (and/or substrate 91), and thereafter, the thermoelectric conversion elements 30 are engagingly attached to the fitted portions 40, 42, 50, 52, 60 of these connectors C1, C2, C3, respectively, whereby the arrays A1, A2, A3, A4 of the thermoelectric conversion elements 30 that are electrically interconnected are formed. Of course, the connectors C1, C2, C3 may be individually engaged with the thermoelectric conversion elements 30 in advance so as to mount the thus formed thermoelectric conversion elements 30 on the substrates 90, 91 in a predetermined array.

In the above constituted thermoelectric conversion module M, the thermal energy generated between a high-temperature portion and a low-temperature portion of each of the thermoelectric conversion elements 30 is converted to electric energy. As electric power, the thus obtained electric energy is supplied to an external electrode via the connector lead portion 64. As explained above, in the present embodiment, at the thermoelectric conversion elements 30 that are adjacent to each other, a first electrode face 30c of one of the elements and an electrode face 30d of another one thereof are electrically connected via connectors C1, C2 formed in a predetermined shape. Therefore, with the use of the connectors C1, C2 such that, in place of a conventional connection lead wire, the lead wire is integrally incorporated (which is formed so that the conventional connection lead wire and fitted portion are integrated with each other), if the thermoelectric conversion elements 30 are electrically connected to each other by means of these connectors C1, C2, the thermoelectric conversion module M can be provided which is free of a continuity failure and which is high in electrical reliability. In this case, as described previously, if the arrays A1, A2, A3, A4 of the thermoelectric conversion element 30 that is electrically interconnected is formed by prefixing the connectors C1, C2, C3 in a predetermined array on the substrate 90 (and/or the substrate 91), and thereafter, engagingly attaching the thermoelectric conversion elements 30 to the fitted portions 40, 42, 50, 52, 60 of these connectors C1, C2, C3, the thermoelectric conversion module can be readily produced, thus making it possible to alleviate assembling inconvenience (manufacturing process) (to improve assembling property). In the present embodiment, further, the thermoelectric conversion element 30 is disposed in a longitudinally erected manner so that the electrode faces 30c, 30d thereof are opposed to the substrates 90, 91 and the main faces 30a, 30b thereof are substantially perpendicular to the substrates 90, 91. If the thermoelectric conversion element 30 is thus arrayed in the longitudinally erected, as described previously, at an introductory section of the embodiment, the dimensions of the longitudinal direction of the thermoelectric conversion element 30 increases, the element resistance increases, and a current is restrained, and a temperature difference between both ends of the element is readily obtained, and an electromotive force increases so that a high thermoelectric conversion efficiency can be obtained. In the thermoelectric conversion module M of the embodiment, further, the arrays A1 to A4 of the thermoelectric conversion element 30 is sandwiched between a pair of the substrates 90 and 91. Thus, after the arrays A1 to A4 of the thermoelectric conversion element 30 are sandwiched between the pair of the substrates 90 and 91, if the thermoelectric conversion element 30 is fixed so as to apply a pressure in a double-door manner, a contact area between the electrode faces 30a, 30b of the thermoelectric conversion element 30 and the connectors C1, C2, C3 increases, so that a continuity failure or a contact failure can be reduced and electrical reliability can be improved. In the thermoelectric conversion module M of the embodiment, further, three types of connectors C1, C2, C3 having the corresponding appropriate shape are used in accordance with the electrical connection position of the module. Thus, the longitudinally thermoelectric conversion element 30 can be modeled with good connectivity and with high efficiency, and the connectors can be selectively used according to the connection form of the thermoelectric conversion element 30, thus making it possible to achieve various types of thermoelectric conversion element arrays according to usages. In the thermoelectric conversion module M of the embodiment, further, the thermoelectric conversion element 30 is formed by a sintered compact of composite-metal oxide, so that heat resistance or dynamic rigidity thereof can be improved. In particular, in the embodiment, the oxide of the composite-metal element was defined as oxide consisting of an alkaline earth metal, rare-earth element, and manganese, whereby heat resistance at a high temperature can be improved more remarkably.

Needless to say, the present invention is not limitative to the aforementioned embodiment, and can be variously modified and implemented without departing from the gist of the invention. For example, while, in the aforementioned embodiment, there was shown an exemplary modular structure in which the electrodes positioned at both faces of these semiconductor elements are formed while they are connected to each other by means of connectors, the present invention is applicable to a modular structure in which an n-type semiconductor element and a p-type semiconductor element are alternately disposed on the substrate and the adjacent semiconductor elements are interconnected by means of electrodes. Further, the shape of the connectors is not limitative to the aforementioned embodiment. For example, if an exemplary modification is shown with respect to the third connector C3, as shown in FIG. 21A, a connector lead portion 64 may be shaped to extend from the center of the first fitted portion 60, as shown in FIG. 21A. In such shape, two types of connectors C3a, C3b as shown in FIG. 21B can be obtained according to the presence or absence of bending at the intermediate portion 69, whereby the connector lead portion 64 can be extended in the same plane from the first and last thermoelectric conversion elements 30A and 30B of the entire array in order to ensure adaptability to a positional relationship of an external electrode, as shown in FIG. 22, for example.

In the aforementioned embodiment, further, a distance between the fitted portions of a connector, to be engaged with both ends of the thermoelectric conversion element in a state in which no thermoelectric conversion element is mounted to the connector may be shorter than that between the electrode faces of the thermoelectric conversion element. Specifically, in respect of the first connectors C1 in the array A1 as shown in FIG. 19, for example, the fitted portions 40, 42 are adjacent to be opposed to each other so as to allow for insertion of one of the connectors C1 having the first fitted portion 40 engaged with the first electrode face 30c and another one of the connectors having the second fitted portion 42 engaged with the second electrode face 30d. In that case, as shown in FIG. 23, a distance Y between the first fitted portion 40 of the adjacent first connector C1 in a state in which the thermoelectric conversion element 30 is not mounted and the second fitted portion 42 of another first connector C1 may be set to be shorter than the distance X between the first electrode face 30c and the second electrode face 30d in the thermoelectric conversion element 30.

By doing this, when the thermoelectric conversion element 30 is engaged with a substantially U-shaped connector C1 with its narrowed tip end, the tip ends of the fitted portions 40, 42 are pushed and broadened, and then, the thermoelectric conversion element 30 is engaged therewith. In this manner, the tip ends of the fitted portions 40, 42 compress the thermoelectric conversion element 30, so that the thermoelectric conversion element 30 can be securely maintained by means of the connector C1. If the thermoelectric conversion element 30 is attached, further, the fitted portions 40, 42, which are opposed to each other, are substantially in parallel to each other, and, in the thermoelectric conversion module, a contact area between the electrode faces 30c, 30d and the fitted portions 40, 42, of the connector C1, can be made uniform. As the result thereof, thermoelectric efficiency can be improved. Of course, such constitution is applicable to the second and third connectors C2, C3.

In the abovementioned embodiment, further, in order to facilitate insertion or engagement of the thermoelectric conversion element 30 into or with the connectors C1, C2, C3, an end rim 99 of the thermoelectric conversion element 30 may be rounded, as shown in FIG. 24. In other words, the end rim 99 of the thermoelectric conversion element 30 may be R-chamfered at a predetermined curvature. By doing this, the thermoelectric conversion element 30 can be smoothly inserted into the connectors C1, C2, C3 without any difficulty. The shape of such thermoelectric conversion element 30 can be readily realized by varying a molding die.

The constitution as shown in FIG. 25 is also considered from the viewpoint of improving the insertion property of the thermoelectric conversion element 30 into the connectors C1, C2, C3. In other words, while FIG. 25 shows the first connector C1 as one example, in this case, the first and second fitted portions 40 and 42, at end rims thereof, have a guide portion 100 (see FIG. 25B and FIG. 25C) which guides attachment of the thermoelectric conversion element 30 and which is inwardly bendable as if it were along the thermoelectric conversion element 30 after the thermoelectric conversion element 30 is engaged with the fitted portions 40, 42. This guide portion 100 is formed in a piece shape, and extends so as to broaden outwardly.

As long as the fitted portions 40, 42 have a guide portion 100, the thermoelectric conversion element 30 can be readily attached to the connector C1 (in particular, its advantageous effect is great if the mount width of the connector fitted portion is set to be smaller than the width of the electrode of the thermoelectric conversion element (in the constitution of FIG. 23), so that assembling efficiency thereof can be improved. Further, the guide portion 100 is bendable as if it were along the thermoelectric conversion element 30, whereby the thermoelectric conversion element can be fixed at the guide portion 100 after the thermoelectric conversion element 30 is attached to the connector C1 (see FIG. 25C) and the attachment stability of the thermoelectric conversion element 30 in the connector C1 can be improved. Therefore, a thermoelectric conversion module can be provided which is free of a continuity failure and is high in electrical reliability. Of course, such constitution is also applicable to the second and third connectors C2, C3.

Further, the constitution as shown in FIG. 26 is also considered to be employed from the viewpoint of improving the attachment stability of the thermoelectric conversion element in a connector. In other words, while FIG. 26 shows the first connector C1 as one example, in this case, the first and second fitted portions 40 and 42 (specifically, bending pieces "e") has a hook-shaped fitted portion 104 to be engagingly fitted in a fixing groove 102 (see FIG. 26A) formed at the top and bottom side of the thermoelectric conversion element 30 (see FIG. 26B). By doing this, the fitted portion 104 of the connector C1 is engagingly fitted in the fixing groove 102 of the thermoelectric conversion element 30 (see FIG. 26C) at the time of attachment, whereby the thermoelectric conversion element 30 is rigidly mounted to the connector C1, so that attachment stability thereof can be improved, and a thermoelectric conversion module can be provided which is free of a continuity failure and is high in electrical reliability. Of course, such constitution is also applicable to the second and third connectors C2, C3.

The constitution as shown in the FIG. 27 is further considered to be employed from the viewpoint of improving the attachment stability of the thermoelectric conversion element in a connector. In other words, while FIG. 27 shows the first connector C1 as one example, in this case, the connection portion 44 constituting a connector lead portion has, at both of the upper and lower sides thereof, parallel portions 120 which extend from the electrode faces 30c, 30d on side faces between the electrode faces 30c, 30d of the thermoelectric conversion element 30, as shown in FIG. 27A. The connector lead portion has such parallel portions 120, whereby a contact area between the connector lead portion (connection portion 44) and the thermoelectric conversion element 30 increases, and thereafter, the thermoelectric conversion element 30 can be retained with a larger area, and the attachment stability of the thermoelectric conversion element 30 in the connector C1 can be improved.

In addition to, or alternatively, independent of this constitution, a fixing member 105 having comb teeth 110 that can be inserted into both sides of the thermoelectric conversion element 30 as shown in FIG. 27B and that have electrical insulation property may be provided in order to ensure further attachment stability. If the fixing member 105 having such comb teeth 110 is provided, the comb teeth 110 are inserted into both sides of one or plural thermoelectric conversion elements 30 (see FIG. 27C and FIG. 27D), and the thermoelectric conversion element 30 is supported in a double-door manner by means of the comb teeth 110 as well, so that the attachment stability of the thermoelectric conversion element 30 in a module can be improved. Advantageously, the fixing member 105 can has electrical insulation property in order to prevent short-circuit, so that, in particular, electrical insulation (preventing short-circuit between the thermoelectric conversion elements 30) can be attained laterally of the thermoelectric conversion element 30 in which the thermoelectric conversion elements 30 are exposed and opposed to each other. In this case, if the fixing member 105 is attached to a cooling face side (low-temperature side), for example, aluminum anode oxidization treatment (anodized-aluminum treatment) is applied; and if the fixing member 105 is attached to a heating face side (high-temperature side), it is preferable that stainless (SUS) be deposited to the fixing member 105 (Physical Vapor Deposition) or that glass coating be applied.

In the aforementioned embodiment, further, the constitution as shown in FIG. 28 can be added. In other words, in the constitution shown in FIG. 28, the first fitted portions 40, 50, 60 of the connectors C1, C2, C3 (that may be the second fitted portion, of course) has a short-circuit piece 130 having a sufficient length for electrically connecting a connector which is bendable and which is adjacent thereto when the connector is bent. This short-circuit piece 130 is rigidly attached to the bending piece "e", for example, and extends along the bending piece "e", and a through hole 130a is provided through which a repairing short-circuit wire (such as a wire) is inserted into an extending portion which further extends from an end rim of the bending piece "e" by a predetermined length.

In such constitution, as shown in FIG. 28B, for example, if one thermoelectric conversion element 30' is damaged or degraded, and then, a continuity failure arises with the connector C1, the short-circuit pieces 130 at both sides of the thermoelectric conversion element 30' are bent, and then, the thermoelectric conversion elements 30, 30 at both sides of the thermoelectric conversion elements 30' are electrically short-circuited by means of a repairing short-circuit wire with the use of the bending portion 130'. Thus, if the short-circuit piece 130 is provided in advance at each connector, even if any of the thermoelectric conversion elements is damaged (degraded), such element(s) can be repaired while continuity between the connectors is readily obtained, without doing any difficult work such as replacement of thermoelectric conversion elements.

BRIEF DESCRIPTION OF THE DRAWINGS

FIG. 11 is a view showing a calculation result as to a voltage, a current, and the exerted maximum output or the like in a case in which the shape of an element is defined as a platy shape and a longitudinally elongated shape.

FIG. 14A is a perspective view showing a state in which thermoelectric conversion elements adjacent to each other between the adjacent arrays are interconnected by means of a connector for the second thermoelectric conversion elements;

FIG. 14B is a front view of the connector for the second thermoelectric conversion elements; and FIG. 14C is a side view of the connector for the second thermoelectric conversion elements.

FIG. 16A is a perspective view showing a state in which a connector for third thermoelectric conversion elements connected to an external element is mounted to a last positioned thermoelectric conversion element of an array;

FIG. 16B is a front view of the connector for the third thermoelectric conversion elements; and FIG. 16C is a side view of the connector for the third thermoelectric conversion elements.

Each of FIGS. 25A to 25C is another exemplary modification of the connector, wherein

Each of FIGS. 26A to 26C is an exemplary modification of a structure in which a thermoelectric conversion element is attached to a connector, wherein

Each of FIGS. 27A to 27D shows still another exemplary modification of a connector, wherein

Each of FIGS. 28A and 28B shows yet another exemplary modification of a connector, wherein

REFERENCE NUMERALS

Figure 1:
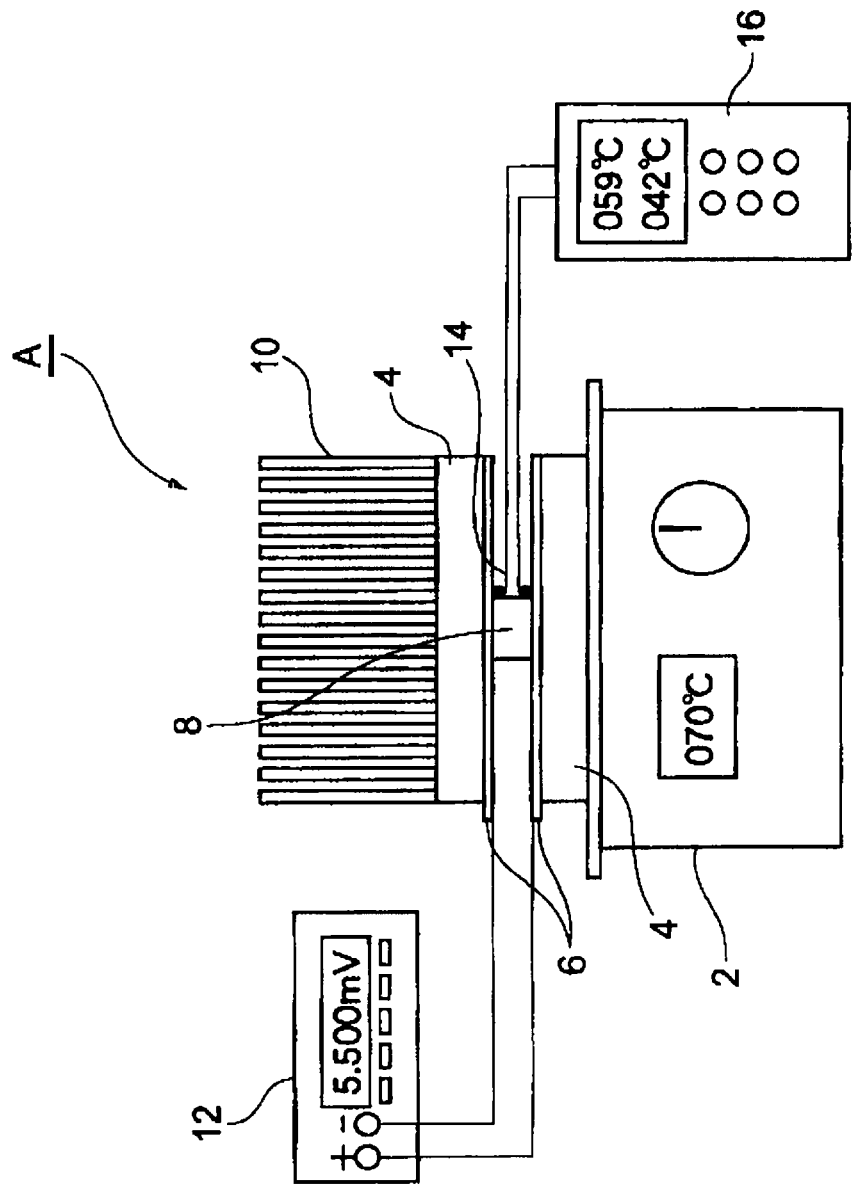
FIG. 1 is a schematic view of a Seebeck coefficient measuring instrument.
Figure 2:
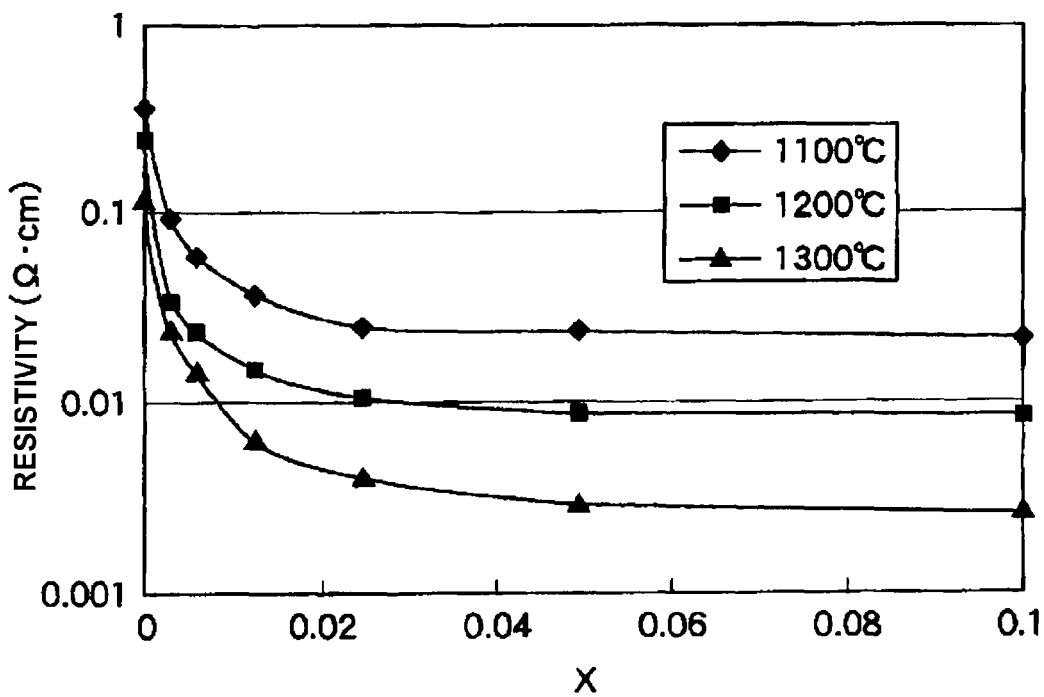
FIG. 2 is a graphic diagram depicting a measurement result of resistivity in a platy sample.
Figure 3:
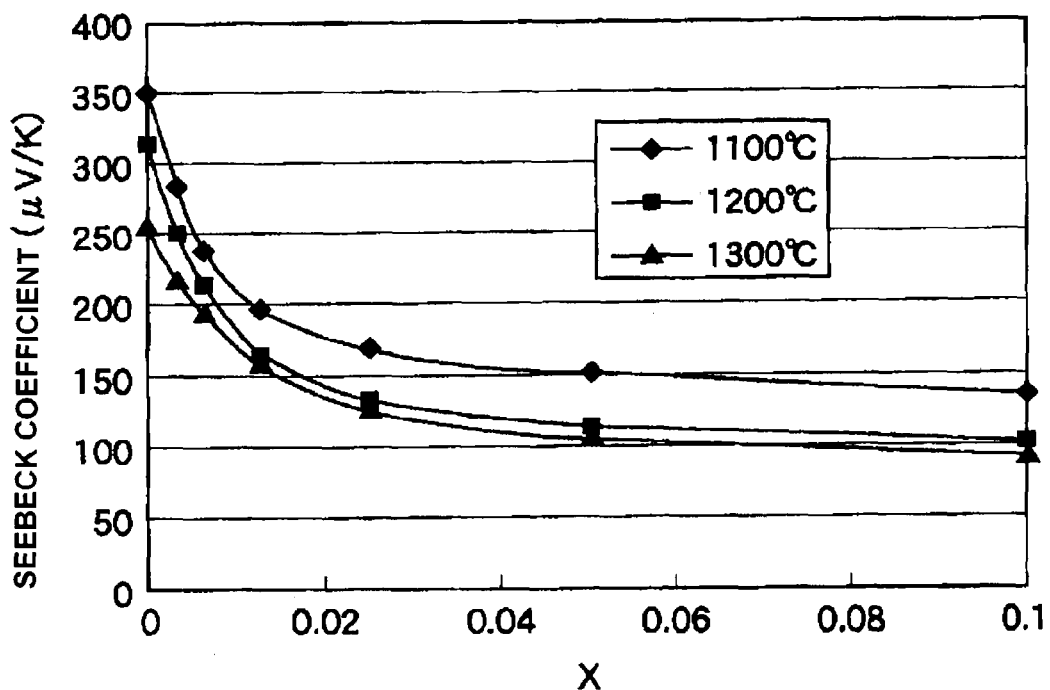
FIG. 3 is a graphic diagram depicting a measurement result of a Seebeck coefficient in a platy sample.
Figure 4:
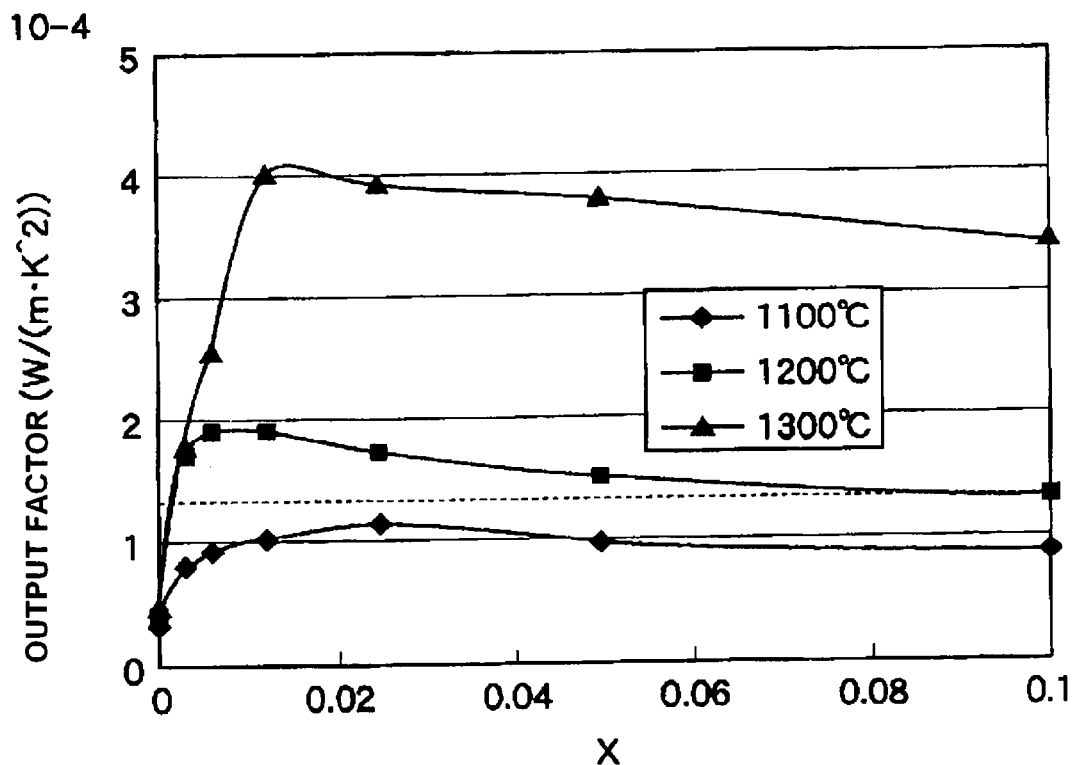
FIG. 4 is a graphic diagram showing a result of an output factor of a platy sample, which is found from the resistivity and Seebeck coefficient shown in FIGS. 2 and 3.
Figure 5:
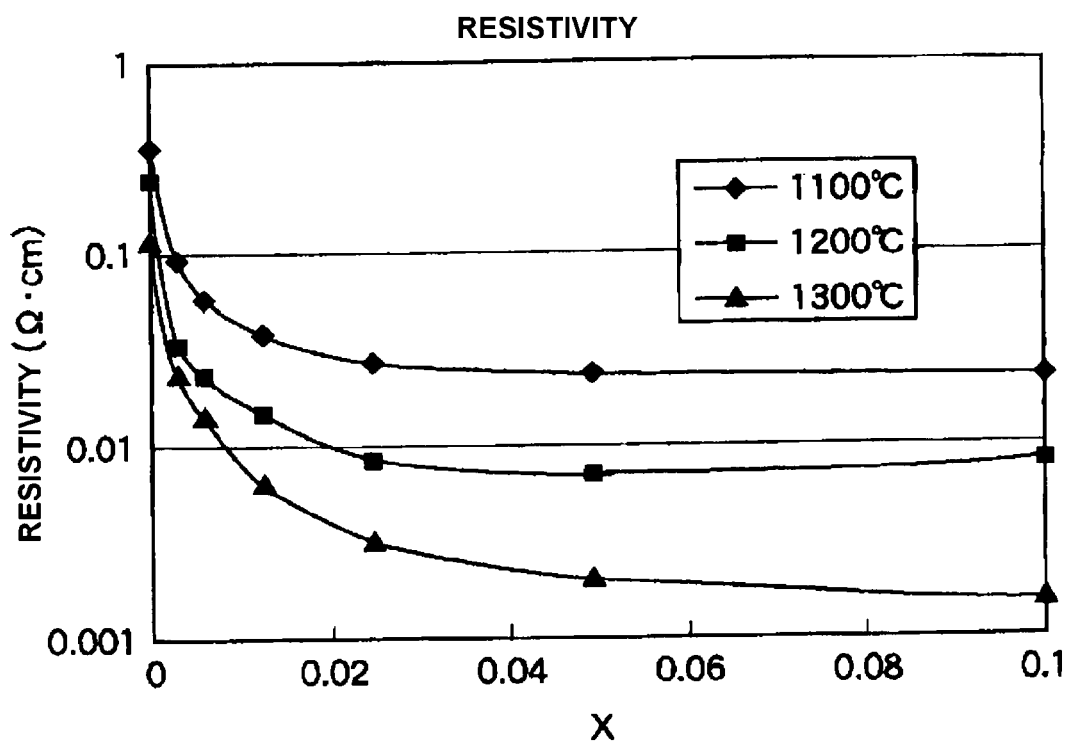
FIG. 5 is a graphic diagram depicting a measurement result of resistivity in a rod-like sample.
Figure 6:
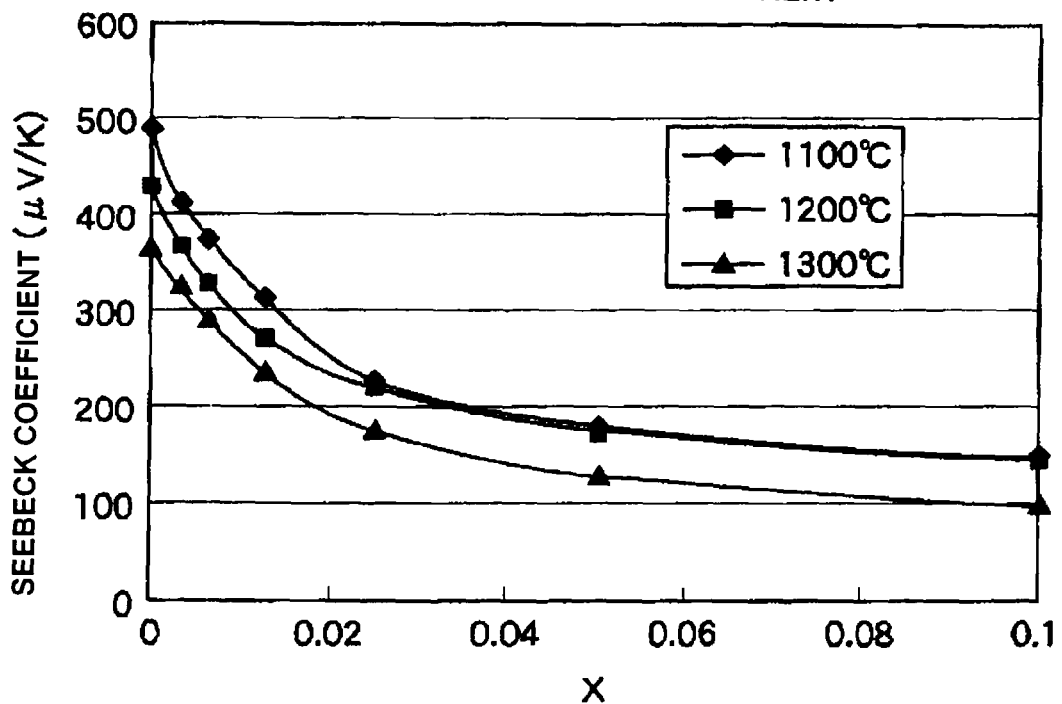
FIG. 6 is a graphic diagram depicting a measurement result of a Seebeck coefficient in the rod-like sample.
Figure 7:
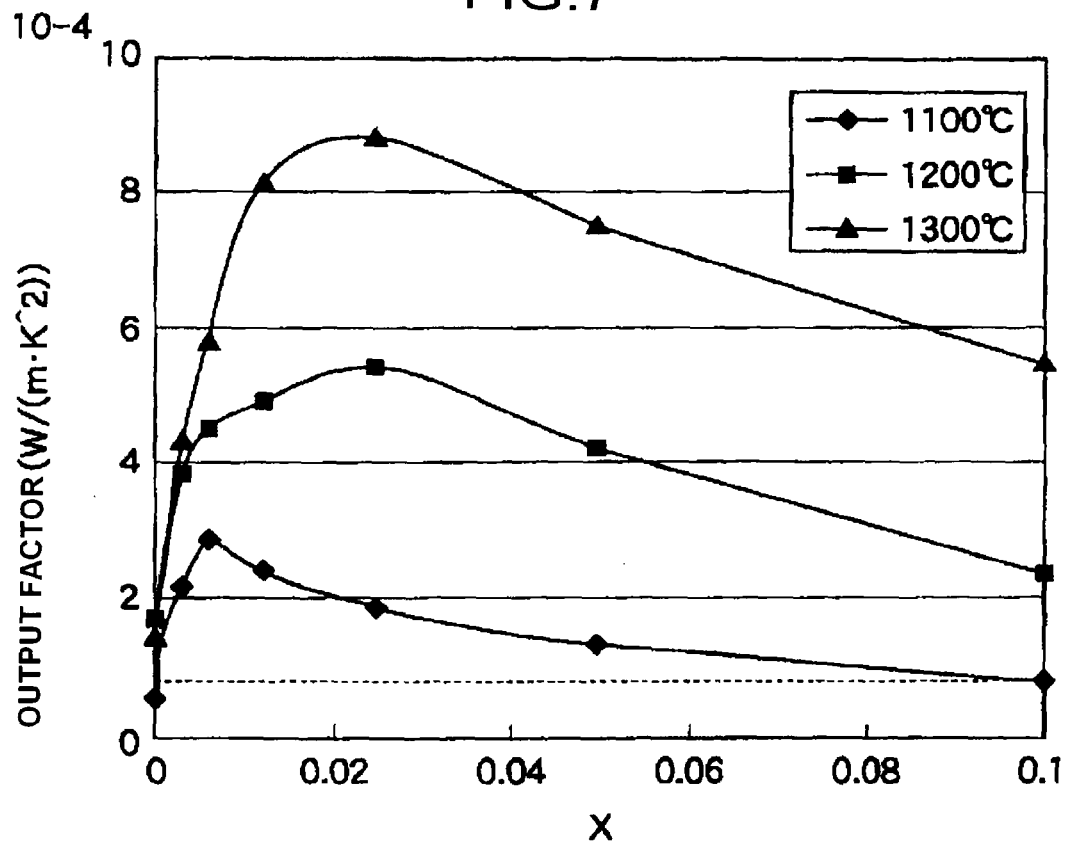
FIG. 7 is a graphic diagram depicting a result of an output factor of the rod-like sample, obtained from the resistivity and Seebeck coefficient shown in FIGS. 5 and 6.
Figure 8:
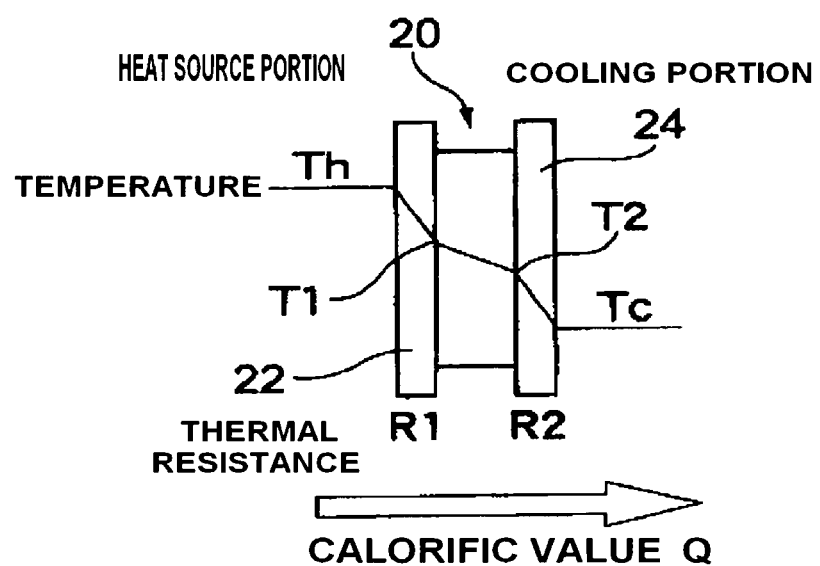
FIG. 8 is a thermal conduction model diagram for explaining an influence of an element length upon a temperature difference.
Figure 9:
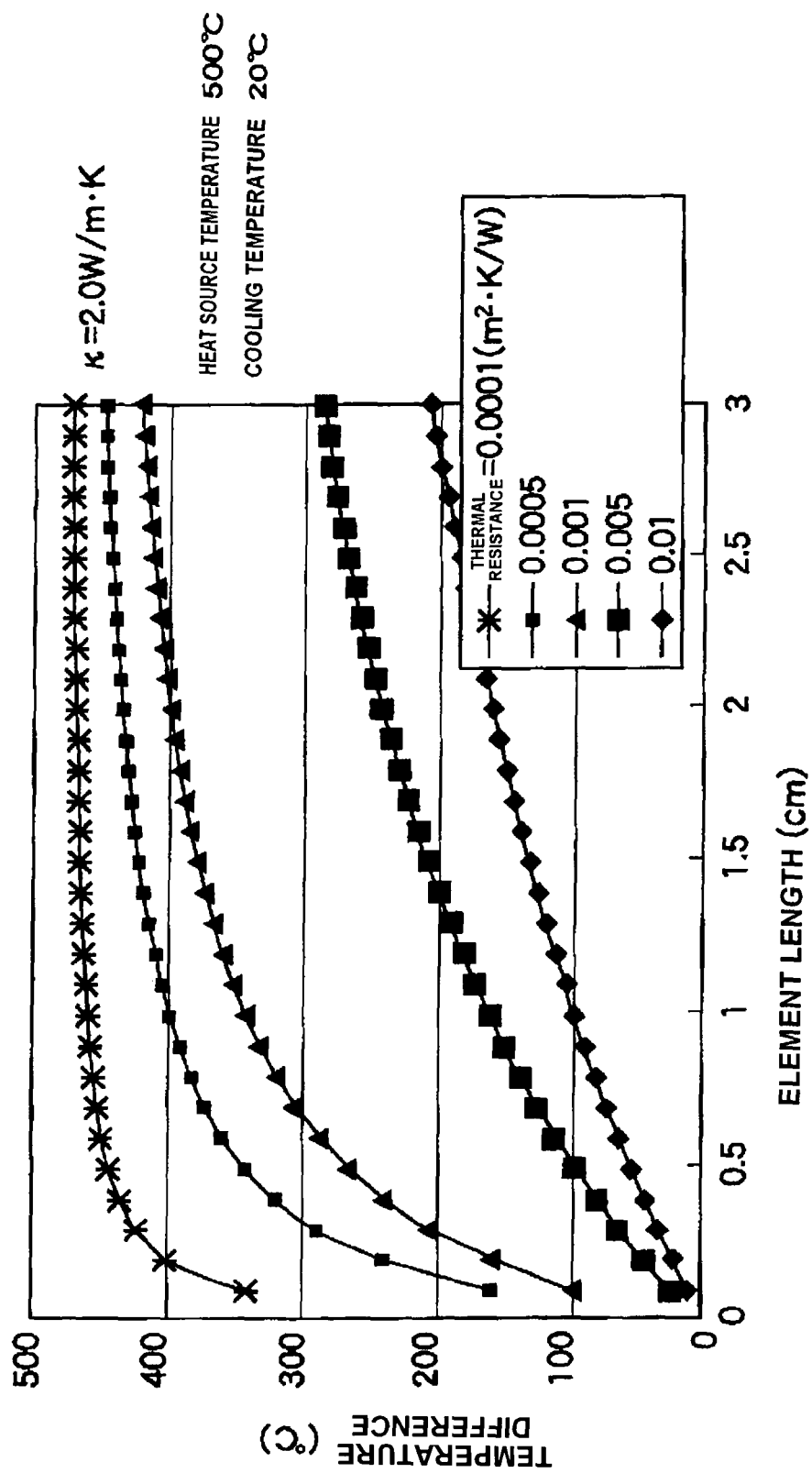
FIG. 9 is a graphic diagram depicting a relationship between an element length and a temperature difference.
Figure 10:
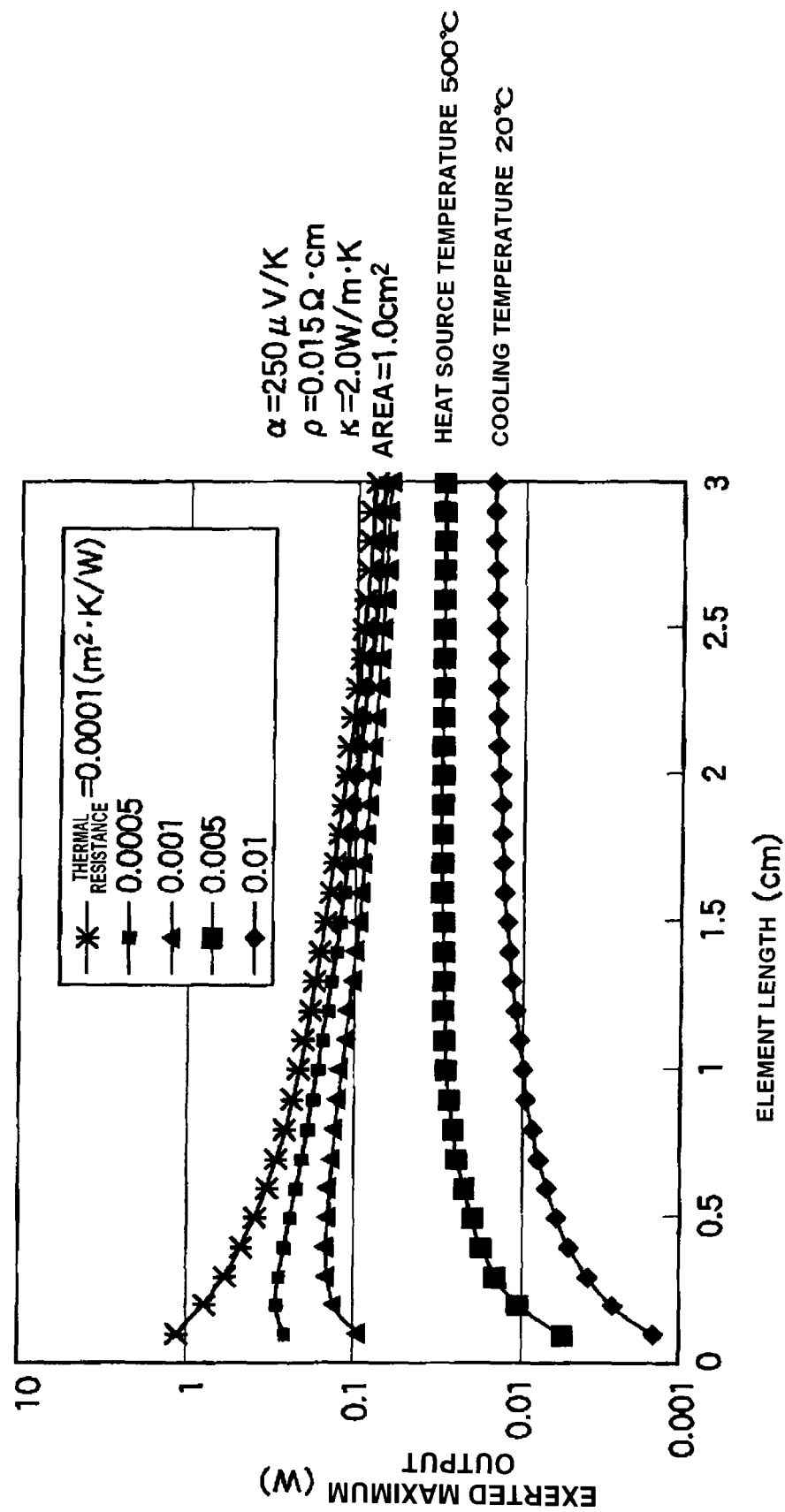
FIG. 10 is a graphic diagram depicting a relationship between an element length and an exerted maximum output.
Figures 12A, 12B, 12C:
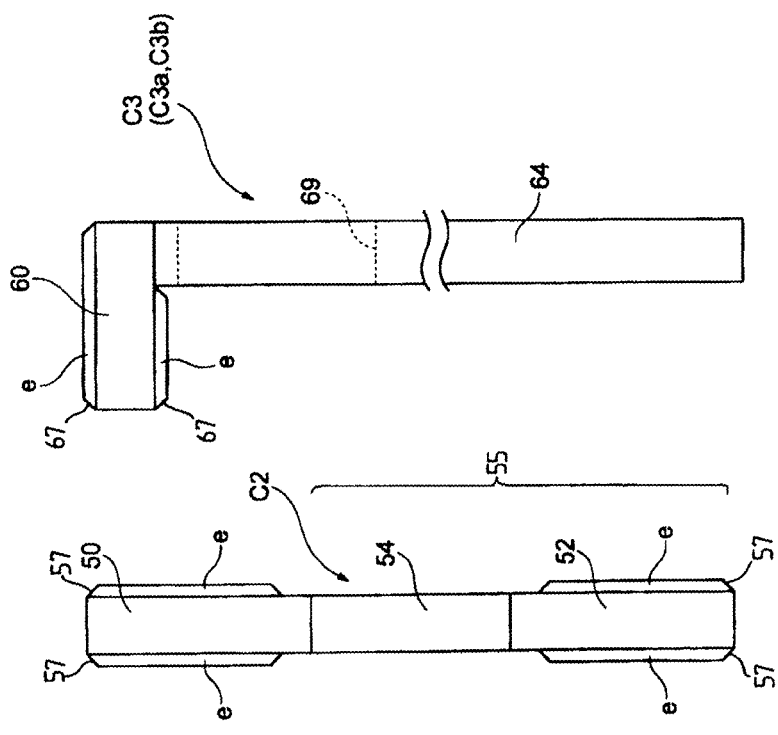
FIG. 12A is a planar side view of an exploded state of a connector for first thermoelectric conversion elements used in the same array of thermoelectric conversion elements.
FIG. 12B is a plan view of an exploded state of a connector for second thermoelectric conversion elements used between the adjacent arrays of thermoelectric conversion elements.
FIG. 12C is a plan view of an exploded state of a connector for third thermoelectric conversion elements used between the array of thermoelectric conversion elements and an external electrode.
Figure 13C:
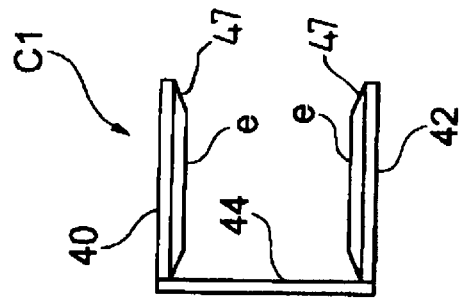
FIG. 13C is a side view of the connector for the first thermoelectric conversion elements.
Figure 13B:
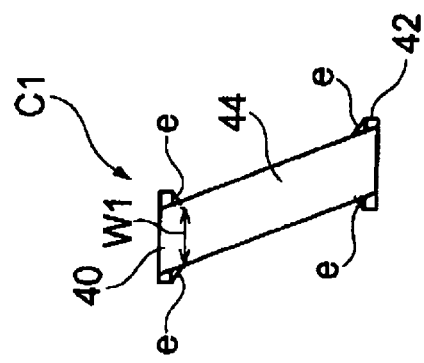
FIG. 13B is a plan view of the connector for the first thermoelectric conversion elements.
Figure 13A:
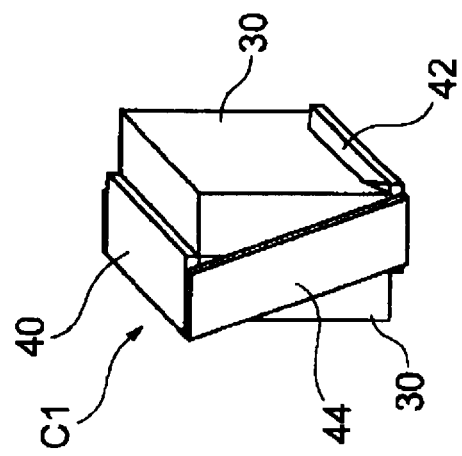
FIG. 13A is a perspective view showing a state in which the adjacent thermoelectric conversion elements in the same array are interconnected by means of a connector for the first thermoelectric conversion elements.
Figure 15C:
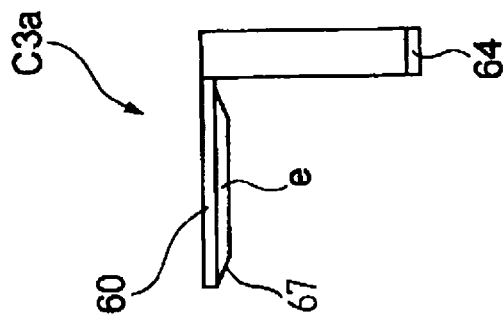
FIG. 15C is a side view of the connector for the third thermoelectric conversion elements.
Figure 15B:
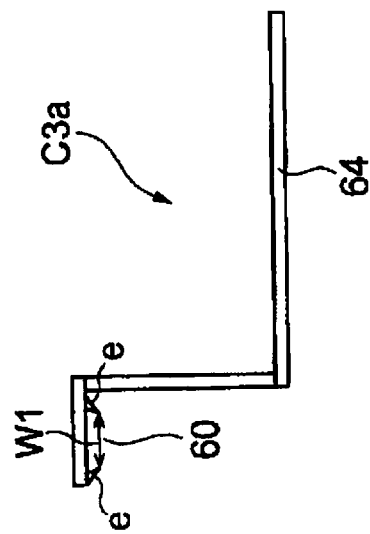
FIG. 15B is a front view of the connector for the third thermoelectric conversion elements.
Figure 15A:
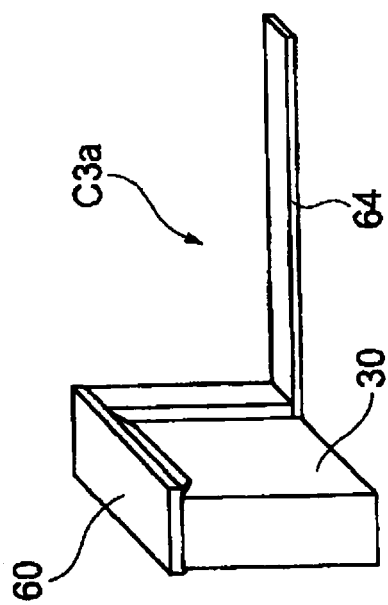
FIG. 15A is a perspective view showing a state in which a connector for third thermoelectric conversion elements connected to an external element is mounted to a first positioned thermoelectric conversion element of an array.
Figure 17:
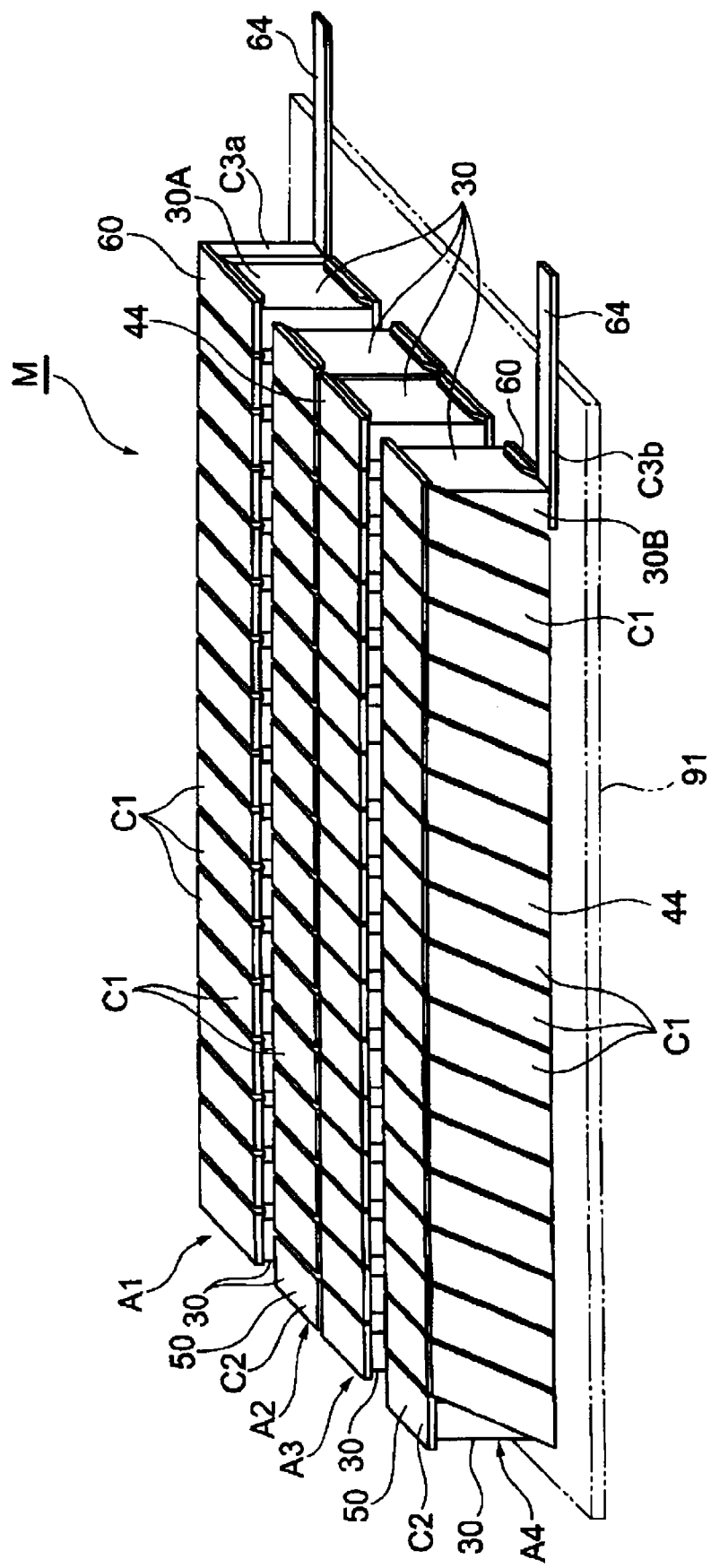
FIG. 17 is a perspective view of a thermoelectric conversion module according to one embodiment of the present invention, in which a plurality of thermoelectric conversion elements were constituted to be electrically connected in a predetermined array with the use of the connectors for the first to third thermoelectric conversion elements.
Figure 18:
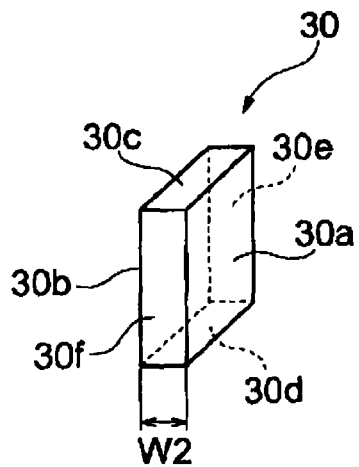
FIG. 18 is a perspective view of a thermoelectric conversion element.
Figure 19:
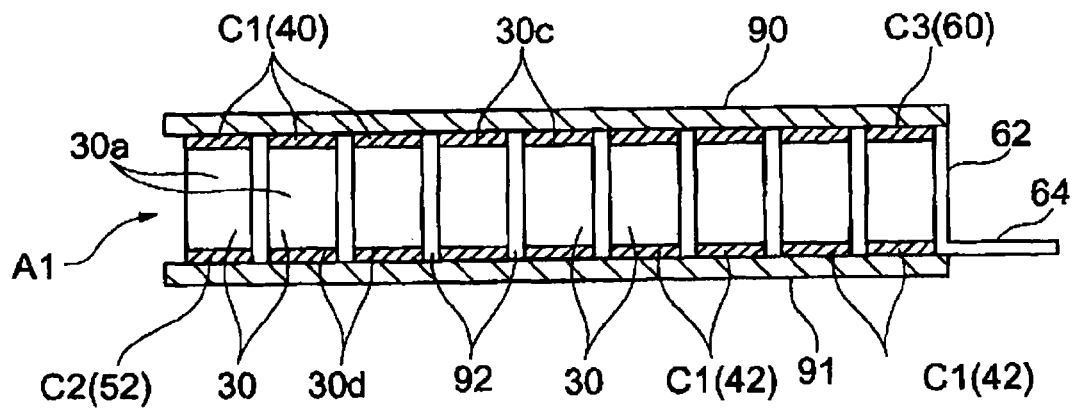
FIG. 19 is a sectional view of a first array viewed in a direction perpendicular to an extension direction thereof.
Figure 20:
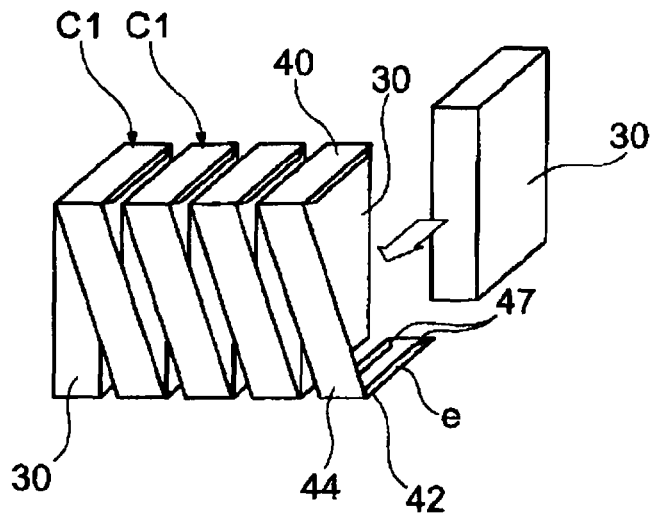
FIG. 20 is a perspective view showing how a thermoelectric conversion element is slidably attached to a first connector.
Figure 21A:
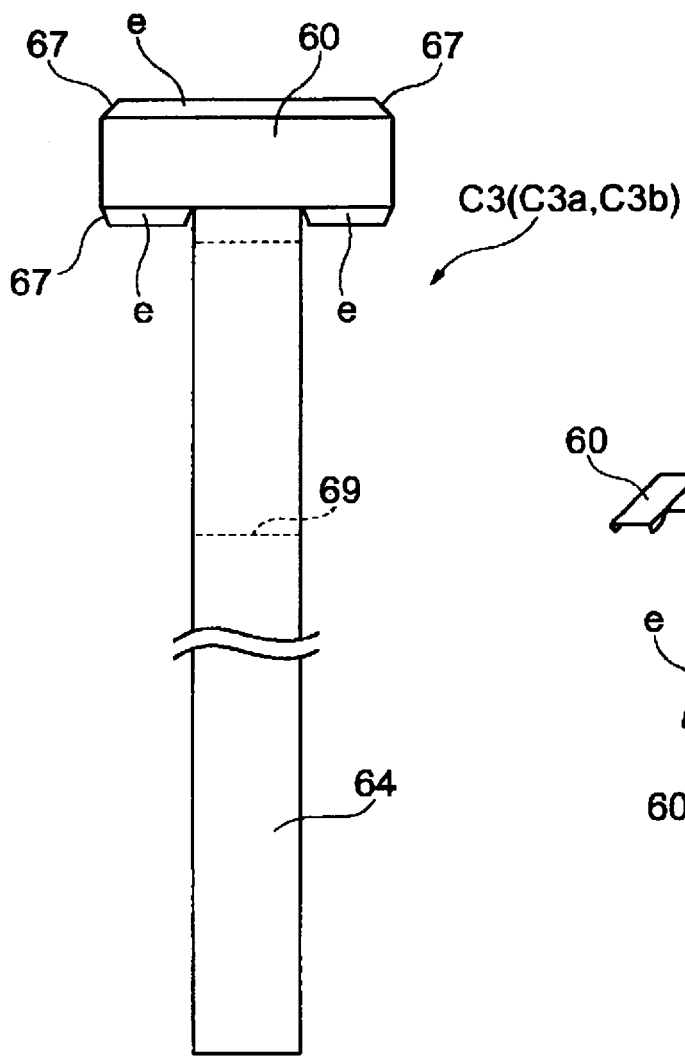
FIG. 21A is a plan view of an exploded state of an exemplary modification of a third connector.
Figure 21B:
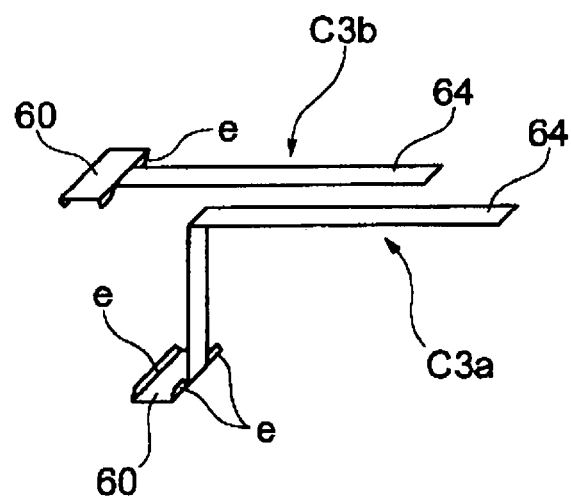
FIG. 21B is a perspective view of a state in which the third connector is bent.
Figure 22:
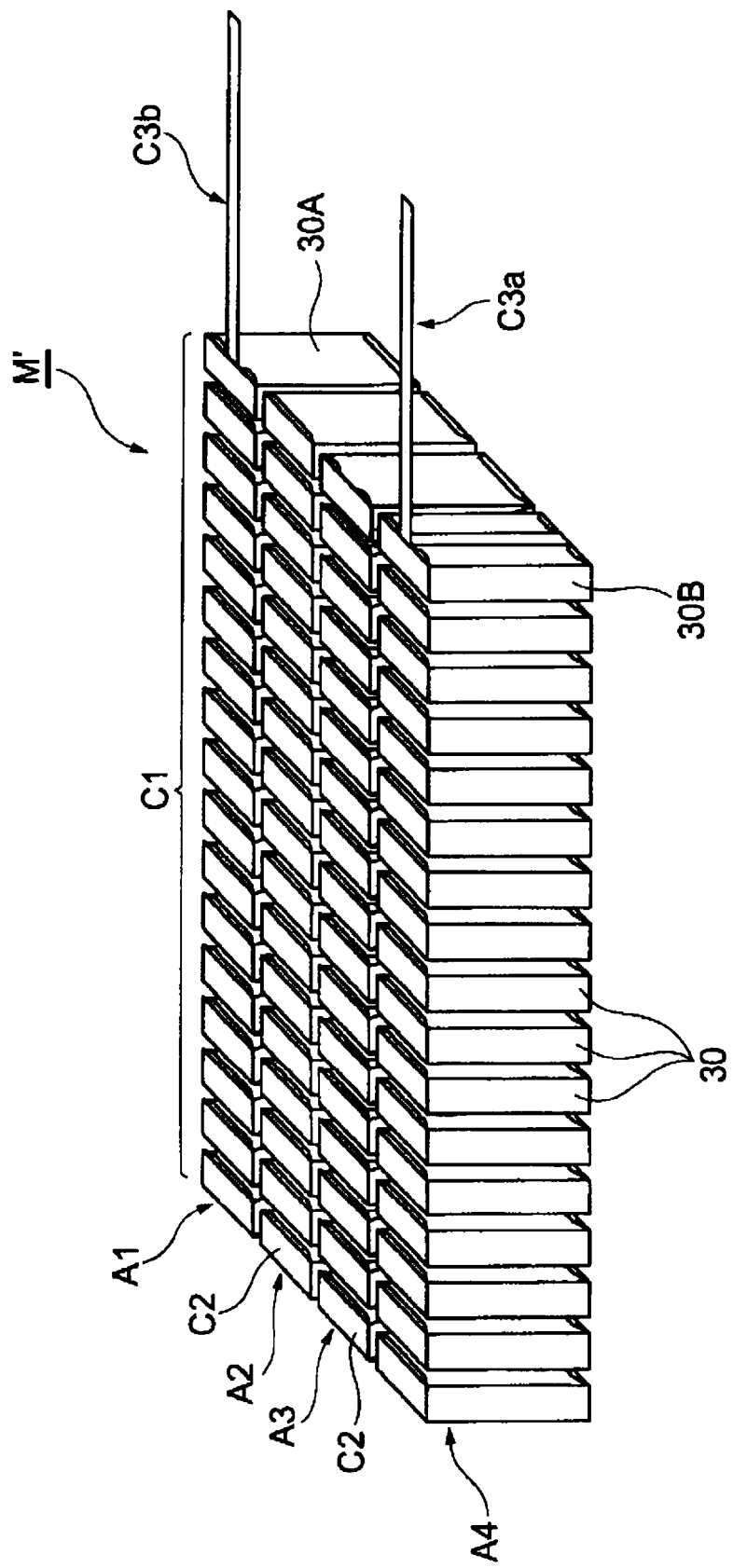
FIG. 22 is a perspective view of a thermoelectric conversion module using the third connector of FIG. 21.
Figure 23:
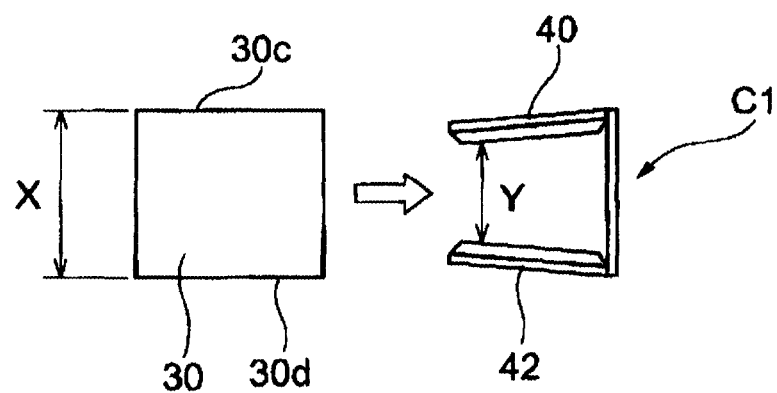
FIG. 23 is a schematic view showing an exemplary modification of the connector.
Figure 24:
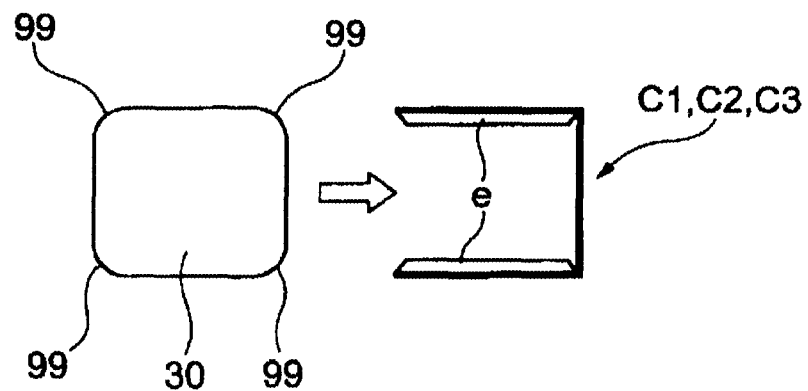
FIG. 24 is a schematic view showing an exemplary modification of a thermoelectric conversion element.
Figure 25A:
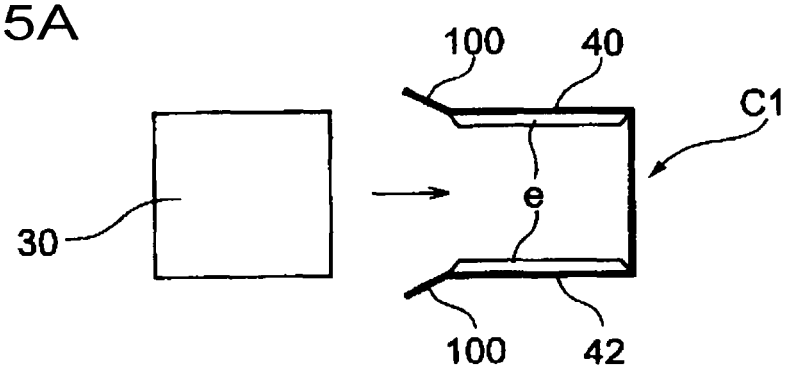
FIG. 25A is a side view showing how a thermoelectric conversion element is slidably attached to the connector.
Figure 25B:
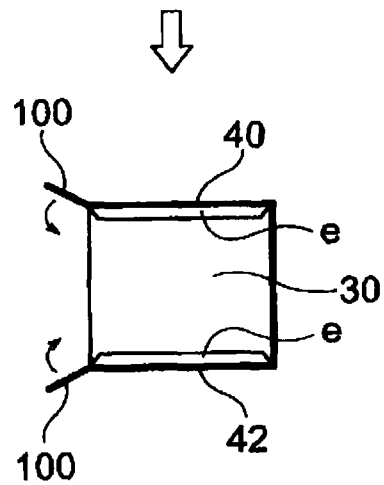
FIG. 25B is a side view showing a state in which the thermoelectric conversion element was slidably attached to the connector.
Figure 25C:
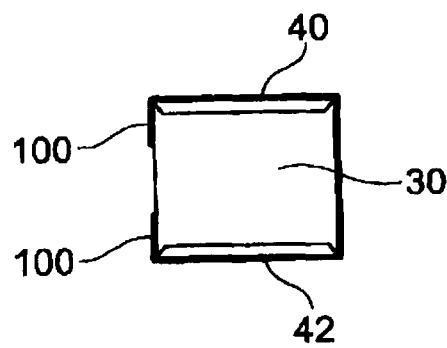
FIG. 25C is a side view showing a state in which a guide portion of the connector was inwardly bent in a state of FIG. 25B.
Figure 26A:
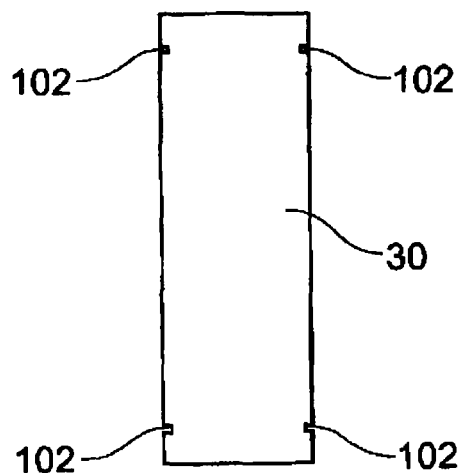
FIG. 26A is a side view of the thermoelectric conversion element.
Figure 26B:
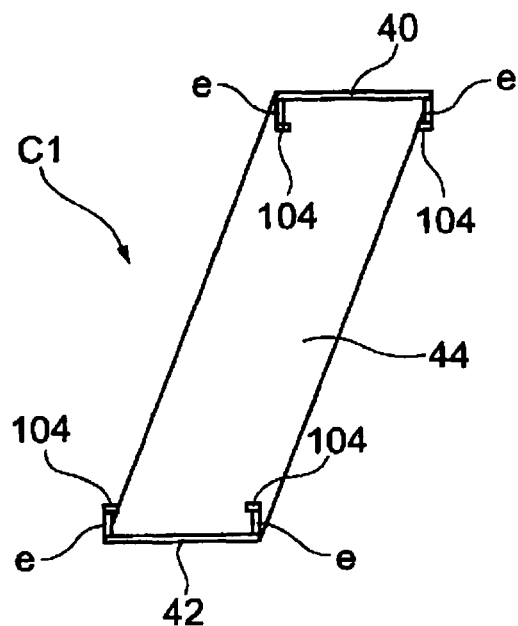
FIG. 26B is a side view of the connector.
Figure 26C:
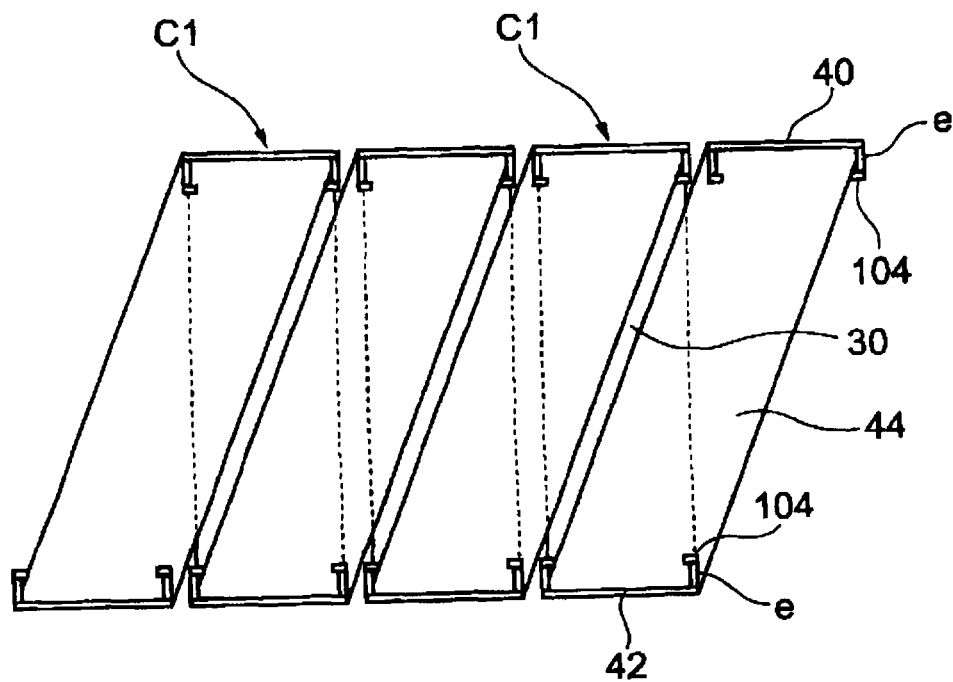
FIG. 26C is a side view of a state in which the thermoelectric conversion element was attached to the connector.
Figure 27A:
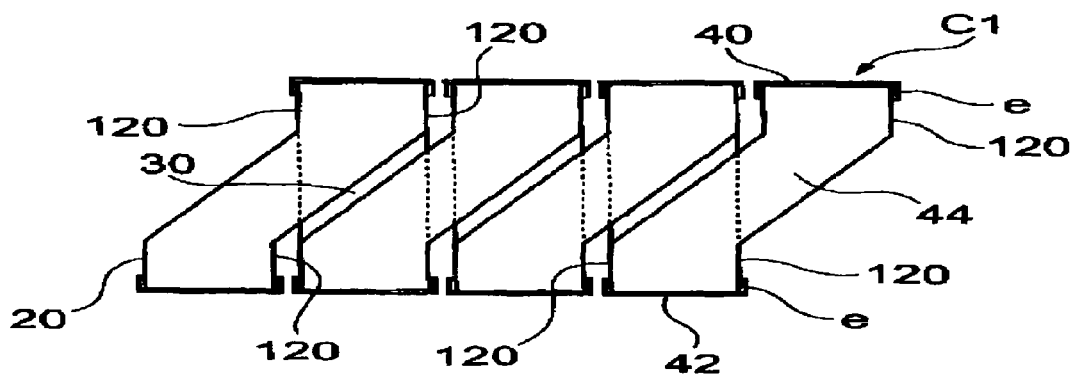
FIG. 27A is a side view of a state in which a thermoelectric conversion element is attached to a connector having a platy portion.
Figure 27B:
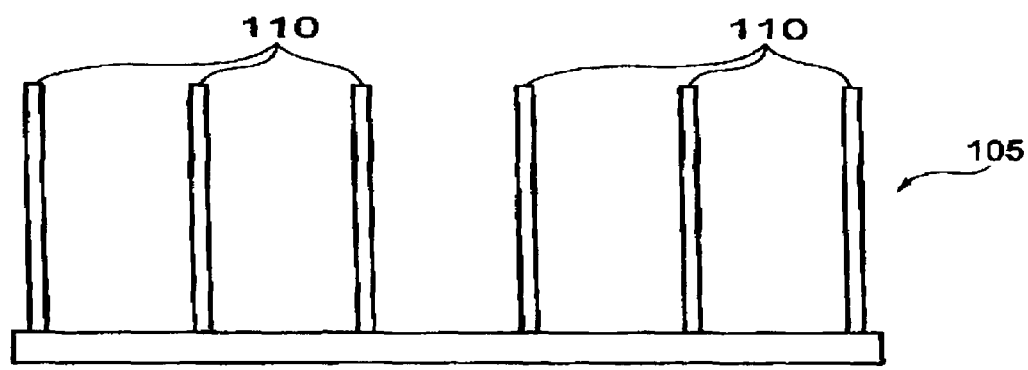
FIG. 27B is a plan view of a fixing member which is combined with the connector or which is provided independently thereof.
Figure 27C:
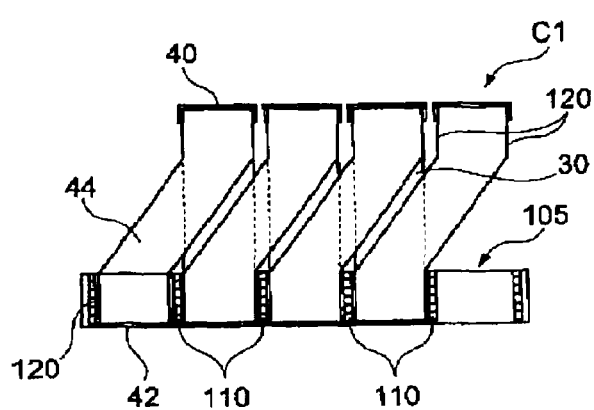
FIG. 27C is a side view of a fixing member attached in a state of FIG. 27A.
Figure 27D:
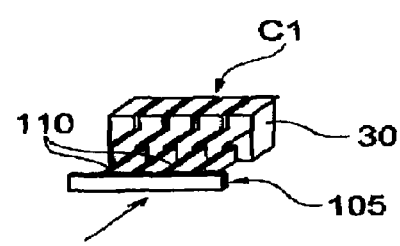
FIG. 27D is a perspective view showing how the fixing member is attached in the state of FIG. 27A.
Figure 28A:
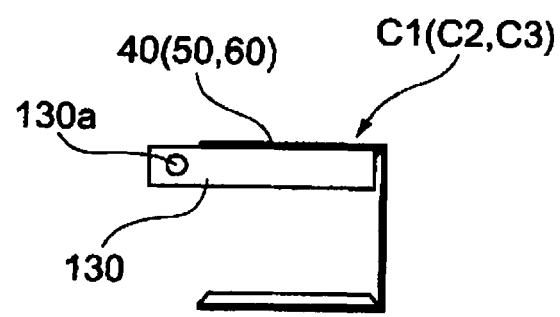
FIG. 28A is a side view of the connector.
Figure 28B:
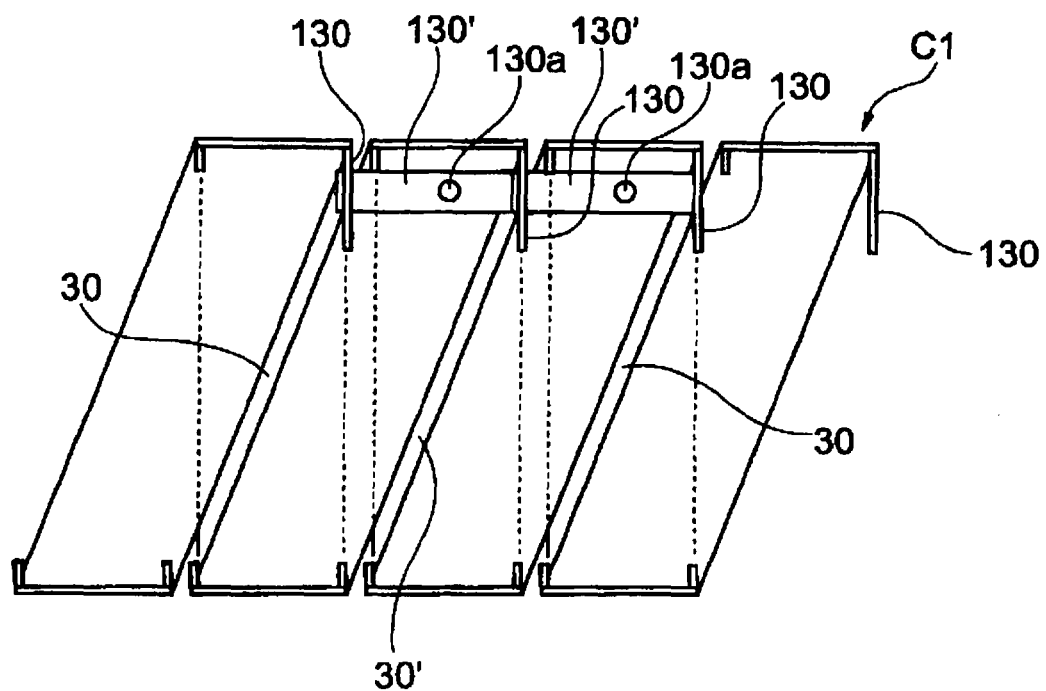
FIG. 28B is a side view of a state in which a thermoelectric conversion element is attached to the connector of FIG. 28A.

30: Thermoelectric conversion element
30a, 30b: Main faces
30a, 30d: Electrode faces
40, 42, 50, 52, 60: Fitted portions
44, 54: Connection portions
64: Connector lead portion
90: First substrate
91: Second substrate
A1: First array
A2: Second array
A3: Third array
A4: Fourth array C1: First connector
C2: Second connector
C3 (C3a, C3b): Third connector
M: Thermoelectric conversion module

The invention claimed is:

1. A thermoelectric conversion module, in which a thermoelectric conversion element is arranged on a substrate and an electrode formed on the thermoelectric conversion element and another electrode which is different therefrom are electrically connected to each other via a conductive connector formed in a predetermined shape,
the connector comprising:
a first fitted portion, which is engagingly mounted to the electrode of the thermoelectric conversion element; and
a connector lead portion, which is electrically connected to the first fitted portion and another electrode, the connector lead portion having a second fitted portion engagingly mounted to an electrode of another thermoelectric conversion element as the another electrode arranged on the substrate, wherein
the first fitted portion and the second fitted portion have bent pieces that are bendable and elastically deformable, and
the bent pieces are configured to engage end edges of respective main surfaces of an electrode of the thermoelectric conversion element and an electrode of the other thermoelectric conversion element with each other so as to be elastically pushed so as to be widened, and each of which has a short-circuit piece of a sufficient length so as to brought into electrical contact with an adjacent connector when bent.

2. The thermoelectric conversion module according to claim 1, wherein
the thermoelectric conversion element has a main face of surface area which is the largest and the electrode is positioned on both sides of the main face of the thermoelectric conversion element, respectively, and the main face of the thermoelectric conversion element is disposed to be longitudinally erected so as to be substantially perpendicular to the substrates.

3. The thermoelectric conversion module according to claim 1, wherein
the connector includes a plurality of connectors, and
the plurality of connectors are prefixed in a predetermined array on the substrate.

4. The thermoelectric conversion module according to claim 1, wherein
the electrode of the thermoelectric conversion element is made up of a pair of a first electrode and a second electrode which are positioned at both sides of the thermoelectric conversion element, and
the thermoelectric conversion element is sandwiched between a first substrate, which is opposed to the first electrode, and a second substrate, which is opposed to the second electrode.

5. The thermoelectric conversion module according to claim 1, wherein
the electrode of the another thermoelectric conversion element is an external element to which the thermoelectric conversion module is electrically connected.

6. The thermoelectric conversion module according to claim 1, wherein
the first fitted portion has a guide portion which guides attachment of the thermoelectric conversion element and which is bendable as it were along the thermoelectric conversion element after the thermoelectric conversion element is attached to the first fitted portion.

7. The thermoelectric conversion module according to claim 1, wherein
the connector lead portion has a parallel portion which extends from the electrode face on a side face between electrode faces of the thermoelectric conversion element.

8. The thermoelectric conversion module according to claim 1, comprising a fixing member which is insertable into both sides of the thermoelectric conversion element and which has electrically insulating comb teeth.

9. The thermoelectric conversion module according to claim 1, wherein
a predetermined array is formed by providing a plurality of the thermoelectric conversion elements in parallel on the substrate, and a predetermined array is formed, and
the connector includes:
a first connector for electrically connecting a plurality of thermoelectric conversion elements in the array; and
a second connector for electrically connecting an electrode of a first or last thermoelectric conversion element in the array, which is connected to the first connector, and the electrode of the another thermoelectric conversion element.

10. The thermoelectric conversion module according to claim 9, wherein
the electrode of the another thermoelectric conversion element to which the second connector is connected is an electrode of the thermoelectric conversion element in another array which is adjacent to the array.

11. The thermoelectric conversion module according to claim 1, wherein
the electrode of the thermoelectric conversion element is made up of a pair of a first electrode and a second electrode which are positioned at both ends of the thermoelectric conversion element;
one of the first and second electrodes is defined as a heating face;
another one is defined as a cooling face; and
electric power is generated due to a temperature difference between the heating face and the cooling face.

12. The thermoelectric conversion module according to claim 1, wherein the thermoelectric conversion element is a sintered compact including composite-metal oxide.

13. The thermoelectric conversion module according to claim 12, wherein
the composite-metal oxide includes an alkaline earth metal, a rare-earth element, and manganese as constituent elements.

14. The thermoelectric conversion module according to claim 1, wherein
the electrode of the thermoelectric conversion element and the electrode of the another thermoelectric conversion element arranged on the substrate are made of a same material.

15. The thermoelectric conversion module according to claim 1, wherein
the electrode thermoelectric conversion element is made of a pair of a first electrode and a second electrode which are positioned at both sides of the thermoelectric conversion element,
the connector includes a plurality of connectors,
one connector having the first fitted portion to be engaged with the first electrode and another connector having the second fitted portion to be engaged with the second electrode are adjacent to each other to oppose the fitted portions to each other so that the thermoelectric conversion element can be inserted; and a distance between the first fitted portion of said one connector and the second fitted portion of the another connector in a state in which the thermoelectric conversion element is not mounted is set to be shorter than a distance between the first and second electrodes in the thermoelectric conversion element.

16. The thermoelectric conversion module according to claim 1, wherein
the first fitted portion or the second fitted portion has a hook-like fitted portion to be engagingly fitted with a fixing groove of the thermoelectric conversion element.

17. A connector for thermoelectric conversion element for electrically connecting an electrode of the thermoelectric conversion element to another electrode,
said connector comprising:
a first fitted portion, which is engagingly mounted to the electrode of the thermoelectric conversion element; and
a connector lead portion, which is electrically connected to the first fitted portion and another electrode, the connector lead portion having a second fitted portion engagingly mounted to an electrode of an another thermoelectric conversion element as the another electrode arranged on the substrate, wherein
the first fitted portion and the second fitted portion have bent pieces that are bendable and elastically deformable, and
the bent pieces are configured to engage end edges of respective main surfaces of an electrode of the thermoelectric conversion element and an electrode of the other thermoelectric conversion element with each other so as to be elastically pushed so as to be widened, and each of which has a short-circuit piece of a sufficient length so as to brought into electrical contact with an adjacent connector when bent.

18. A thermoelectric conversion module, in which a thermoelectric conversion element is arranged on a substrate and an electrode formed on the thermoelectric conversion element and another electrode which is different therefrom are electrically connected to each other via a conductive connector formed in a predetermined shape, the connector comprising:
a first fitted portion, engagingly mounted to the electrode of the thermoelectric conversion element; and
a connector lead portion, electrically connected to the first fitted portion and another electrode, the connector lead portion having a second fitted portion engagingly mounted to an electrode of another thermoelectric conversion element as the another electrode arranged on the substrate, and each of the first fitted portion and the second fitted portion includes:
a bending piece which are elastically deformable, and
a tapered portion is formed at rims at both ends of the bending piece, wherein
the bent pieces are configured to engage end edges of respective main surfaces of an electrode of the thermoelectric conversion element and an electrode of the other thermoelectric conversion element with each other so as to be elastically pushed so as to be widened, and each of which has a short-circuit piece of a sufficient length so as to brought into electrical contact with an adjacent connector when bent.

* * * * *